United States Patent
Jones et al.

(10) Patent No.: US 7,658,470 B1
(45) Date of Patent: *Feb. 9, 2010

(54) METHOD OF USING A FLEXIBLE CIRCUIT

(75) Inventors: Brian Jones, Albany, OR (US); Robert Weber, Albany, OR (US); Cary G Addington, Albany, OR (US); Si-Lam Choy, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 626 days.

This patent is subject to a terminal disclaimer.

(21) Appl. No.: 11/118,200

(22) Filed: Apr. 28, 2005

(51) Int. Cl.
*B41J 2/14* (2006.01)
*B41J 2/175* (2006.01)
*B41J 2/05* (2006.01)

(52) U.S. Cl. ............... 347/50; 347/86; 347/58
(58) Field of Classification Search ............ 347/20, 347/50, 57, 58, 62, 63, 86, 87
See application file for complete search history.

(56) References Cited

U.S. PATENT DOCUMENTS

| | | | |
|---|---|---|---|
| 4,784,615 A * | 11/1988 | Teng-Hong | ............... 439/496 |
| 4,931,134 A | 6/1990 | Hatkevitz et al. | |
| 4,959,119 A | 9/1990 | Lantzer | |
| 5,144,534 A | 9/1992 | Kober | |
| 5,189,787 A * | 3/1993 | Reed et al. | ............... 29/831 |
| 5,219,640 A | 6/1993 | Gazit | |
| 5,572,346 A * | 11/1996 | Sakamoto et al. | ............ 349/150 |
| 5,847,356 A | 12/1998 | Santhanam | |
| 6,011,301 A | 1/2000 | Chiu | |
| 6,058,132 A | 5/2000 | Iso | |
| 6,074,725 A | 6/2000 | Kennedy | |
| 6,325,491 B1 * | 12/2001 | Feinn | ............... 347/50 |
| 6,536,871 B1 | 3/2003 | Haddick | |
| 6,635,226 B1 | 10/2003 | Tso | |
| 6,667,557 B2 | 12/2003 | Alcoe | |
| 6,741,426 B2 | 5/2004 | Girard | |
| 6,770,322 B1 | 8/2004 | Moles | |
| 6,902,256 B2 * | 6/2005 | Anderson et al. | ............ 347/56 |
| 2004/0056926 A1 | 3/2004 | Samoto | |
| 2004/0099645 A1 | 5/2004 | Kawamoto | |
| 2004/0183859 A1 | 9/2004 | Ito | |

* cited by examiner

*Primary Examiner*—Shih-wen Hsieh

(57) ABSTRACT

A method of using a flexible circuit, including attaching a first portion of the flexible circuit, via an attaching surface of the flexible circuit, to a first surface of a chip carrier. Statically bending a bending portion of the flexible circuit around an edge formed at the intersection of the first surface of the chip carrier, and a second surface of the chip carrier. Adhesively attaching a second portion of the flexible circuit, via the attaching surface, to the second surface of the chip carrier, where the second portion of the flexible circuit has at least one first anchor structure formed in the attaching surface, where the at least one first anchor structure is adapted to accept an adhesive.

62 Claims, 15 Drawing Sheets

METHOD OF USING A FLEXIBLE CIRCUIT

CROSS REFERENCE TO RELATED APPLICATION

The present application is related to co-pending and commonly assigned patent application Ser. No. 11/118,201 filed on the same day herewith Robert Weber, Silam Choy, Cary Addington, and Brian Jones and entitled "Method of Using a Flexible Circuit."

BACKGROUND

Description of the Art

Over the past few years, the demand for ever cheaper and lighter weight electronic devices, including portable devices, has led to a growing need to manufacture durable, lightweight, and low cost electronic circuits of increasing complexity. Many of these electronic devices utilize flexible circuits to make various electrical interconnections. Electronic packaging designers today are faced with packing flexible circuits into ever smaller spaces or attaching them to smaller parts having complex shapes. As the desire to generate tighter bends in flexible circuits increases the residue stress on the flexible circuit also increases. In addition, the difficulty in reliably securing the flexible circuit around such tight bends increases. Further, the increase in stress may result in an increase in broken circuit connections or in delamination of various layers leading to degradation due to environmental causes such as corrosion. This is especially true in the area of microfluidics where fluid may be in close proximity to the electrical traces of the flexible circuit. Consumer demand for cheaper, smaller, more reliable, higher performance devices constantly puts pressure on improving and developing cheaper more reliable materials and manufacturing processes. The ability to optimize the bending radius of flexible circuits will open up a variety of applications that are currently either impractical or are not cost effective.

BRIEF DESCRIPTION OF THE DRAWINGS

FIG. 1b is a cross-sectional view along 1b-1b of the flexible circuit shown in FIG. 1a.

FIG. 3b is a cross-sectional view along 3b-3b of the fluid ejection cartridge shown in FIG. 3a.

FIG. 3c is a cross-sectional view along 3c-3c of the fluid ejection cartridge shown in FIG. 3a.

FIG. 3d is a cross-sectional view along 3d-3d of the fluid ejection cartridge shown in FIG. 3a.

FIG. 4b is a perspective view of the assembled fluid ejection printhead shown in FIG. 4a.

DESCRIPTION OF THE PREFERRED EMBODIMENTS

This invention is directed to utilizing anchor structures created in a flexible circuit to provide a strong adhesive bond in a region of the flexible circuit that is tightly and statically bent or wrapped over an edge of a die carrier. In addition to the adhesive strength of the bond formed between the adhesive and the flexible circuit material, the cleat-like structure provides additional adhesive strength, in the region of the tight static bend, it is believed but not limited by the cohesive strength of the adhesive utilized to form the cleat like structure. A wide variety of anchor structures may be utilized in the present invention such as recessed structures and even through holes through which an adhesive may flow to create a cleat-like structure. The present invention may utilize a wide variety of flexible circuits including both the more conventional flexible circuit structures utilizing an adhesive to bond a metal conductor to a dielectric substrate material and to those flex circuits generally referred to as adhesiveless flexible circuit structures. In addition, both symmetrical (i.e. thickness of flexible circuit about the conductor center line) and asymmetrical flexible circuit structures may be utilized in the present invention.

It should be noted that the drawings are not true to scale. Further, various elements have not been drawn to scale. Certain dimensions have been exaggerated in relation to other dimensions in order to provide a clearer illustration and understanding of the present invention. In particular, vertical and horizontal scales may differ and may vary from one drawing to another. In addition, although some of the embodiments illustrated herein are shown in two dimensional views with various regions having height and width, it should be clearly understood that these regions are illustrations of only a portion of a device that is actually a three dimensional structure. Accordingly, these regions will have three dimensions, including length, width, and height, when fabricated on an actual device.

Moreover, while the present invention is illustrated by various embodiments, it is not intended that these illustrations be a limitation on the scope or applicability of the present invention. Further it is not intended that the embodiments of the present invention be limited to the physical structures illustrated. These structures are included to demonstrate the utility and application of the present invention to presently preferred embodiments.

Figure 1A:
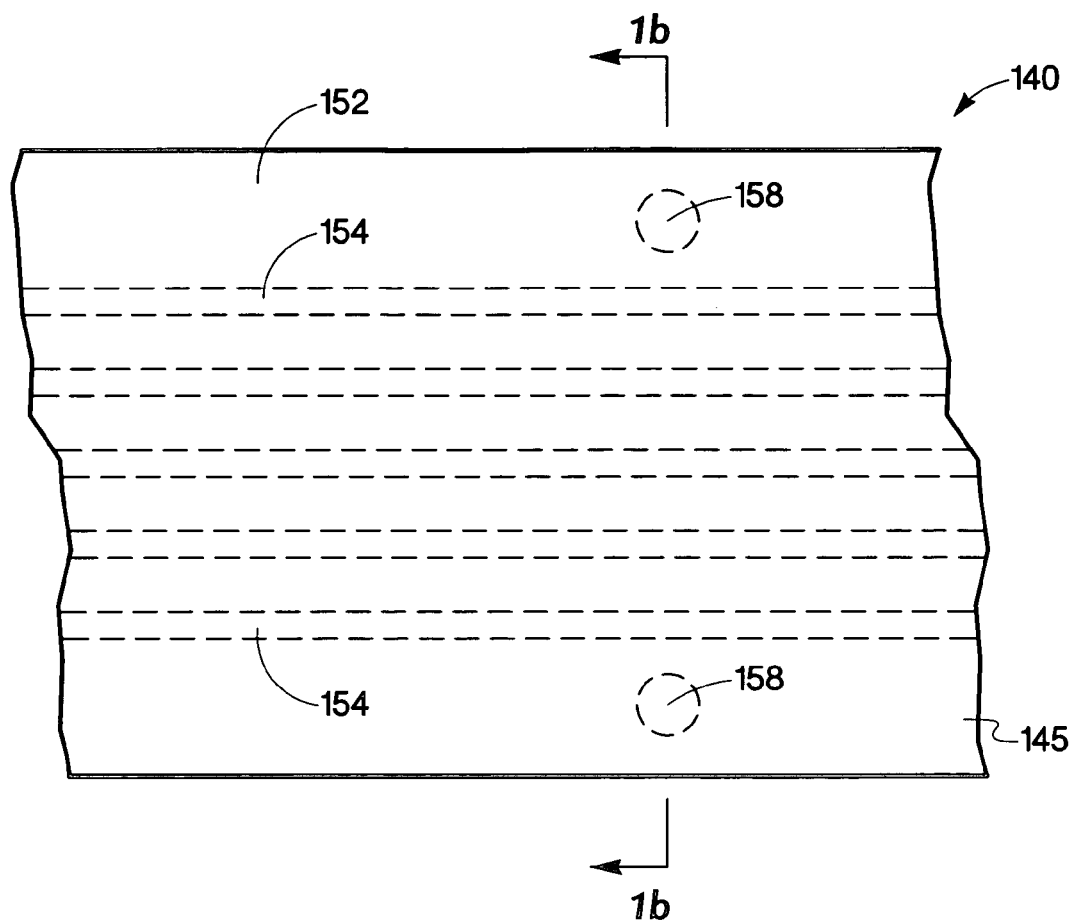
FIG. 1a is a top plan view of a portion of a flexible circuit according to an embodiment of the present invention.
Figure 1B:
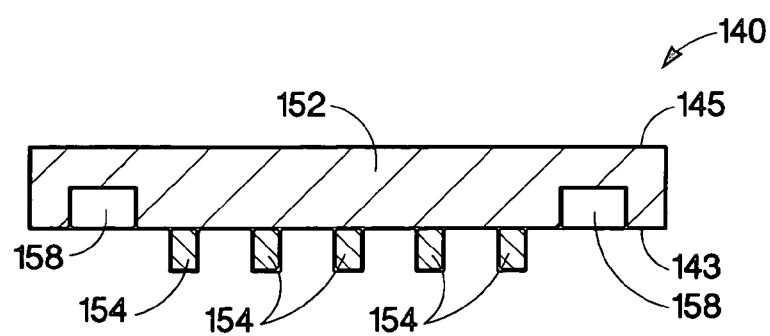
Figure 1C:
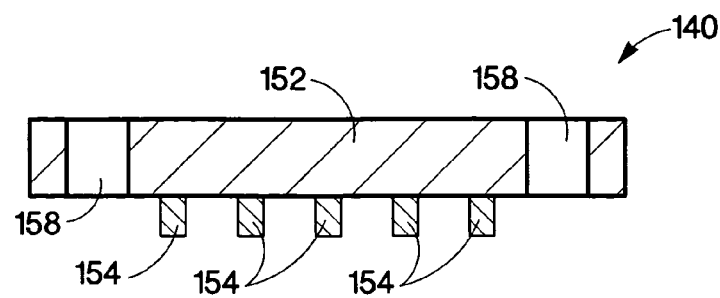
FIG. 1c is a cross-sectional view of a flexible circuit according to an alternate embodiment of the present invention.

A top plan view of a portion of a flexible circuit according to an embodiment of the present invention is illustrated in FIG. 1a. In this embodiment, flexible circuit 140 includes electrical conductors 154 disposed on insulative layer 152. Electrical conductors 154 carry electrical power, signals, or combinations of both in an electronic apparatus. In FIG. 1 five electrically conductive lines are shown for illustrative purposes, however, it is to be understood that generally the flexible circuit will include one or more conductive lines. As illustrated, in FIG. 1b, flexible circuit 140, includes anchor structures 158 formed in attaching surface 143 of first insulative layer 152. Anchor structures 158 have a depth or described differently the anchor structures extend a pre-determined distance into first insulative layer 152 toward external surface 145 of flexible circuit 140. Anchor structures 158, in this embodiment, form what can generally referred to as a recessed region or a cavity in first insulative layer 152. In this embodiment, flexible circuit 140 is commonly referred to as an adhesiveless flex wherein electrical conductors 154 are formed directly on attaching surface 143 of first insulative layer 152 utilizing, typically, various combinations of sputter deposition, electroless deposition, and electrodepostion. However in alternate embodiments a wide range of flexible circuit structures including flexible circuits utilizing adhesives to bond the various layers together also may be utilized as will be described later. In addition, symmetrical and asymmetrical flex circuits also may be utilized. An alternate embodiment of flexible circuit 140 that may be utilized in the present invention is shown, in a cross-sectional, view in FIG. 1c. In this embodiment, anchor structures 158 form anchor holes that extend through flexible structure 140.

Figure 1D:
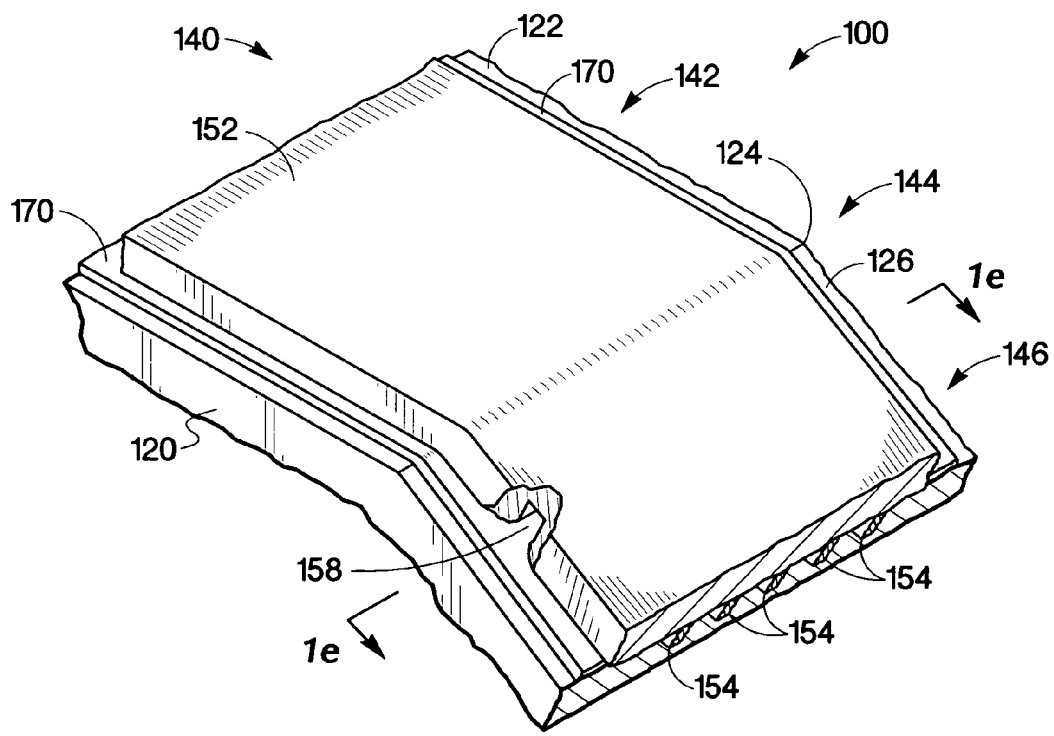
FIG. 1d is a perspective view of the flexible circuit shown in FIG. 1a bent around an edge of a chip carrier according to an embodiment of the present invention.
Figure 1E:
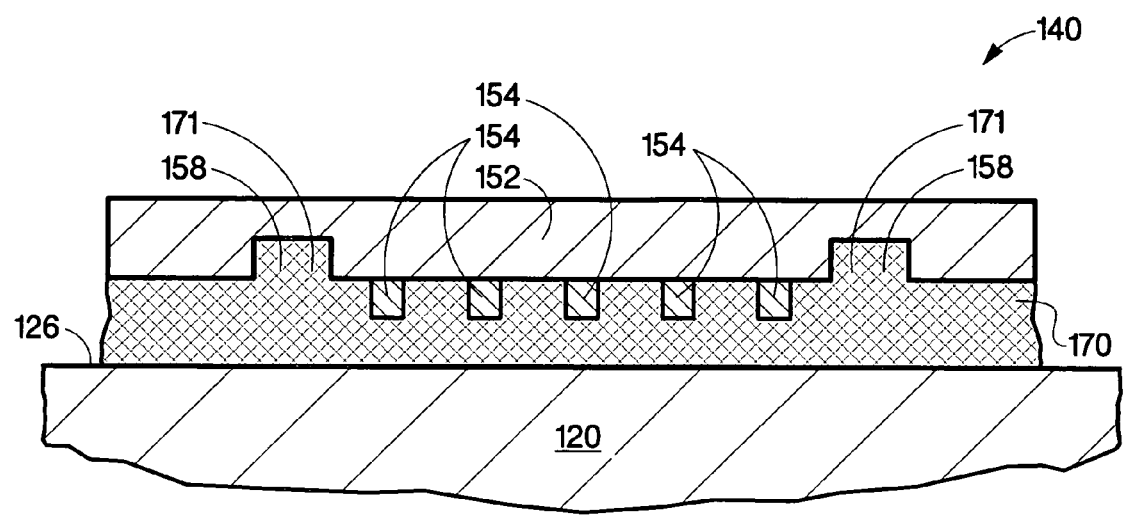
FIG. 1e is a cross-sectional view along 1e-1e of the flexible circuit and the chip carrier shown in FIG. 1d.

A perspective view of a portion of a flexible circuit and a portion of a chip carrier that may be utilized in an embodiment of the present invention is illustrated in FIG. 1d. In this embodiment, chip carrier 120, of electronic apparatus 100, includes carrier edge 124 that is formed at the intersection of first surface 122 and second surface 126. Electronic apparatus 100 also includes flexible circuit 140 that carries electrical power, signals, or combinations of both from one portion of chip carrier 120 to another portion of the electronic apparatus. Flexible circuit 140 includes conductive lines 154 attached to first insulative or dielectric layer 152. Flexible circuit 140 also includes first portion 142 that is adhesively attached or mounted, to first surface 122 of chip carrier 120 via attaching adhesive layer 170. However, in alternate embodiments, the first portion of the flexible circuit also may be mechanically fastened to the first surface 122 of the chip carrier utilizing a wide variety of techniques such as, bendable tabs, deformable posts and various mechanical fasteners to name just a few examples of the techniques that may be utilized. In addition, flexible circuit 140 includes bending portion 144 of flexible circuit 140 that is bent or wrapped around carrier edge 124. Flexible circuit 140 also includes second portion 146 that is adhesively attached or mounted to second surface 126 of chip carrier 120 as shown in FIG. 1d. In this embodiment, first surface 122 includes a first surface normal (not shown) extending away from first surface 122, and second surface 126 includes a second surface normal (not shown) extending away from second surface 126 and intersects with the first surface normal at an angle greater than about 10 degrees. In one particular embodiment the first surface normal intersects the second surface normal at an angle of ninety degrees. In the embodiment shown in FIG. 1d, flexible circuit 140 includes any of the various flexible circuit structures including adhesive and adhesiveless as well as symmetrical and asymmetrical flex circuits.

In this embodiment, during the bonding process attaching adhesive layer 170 is heated to at least its softening temperature (i.e. a temperature sufficient for the adhesive to exhibit flow at reasonable pressures). Flexible circuit 140 is urged toward attaching adhesive layer 170 causing adhesive to flow into anchor structures 158 to form adhesive anchor 171 as shown in a cross-sectional view in FIG. 1e. The particular temperature and pressure utilized will depend on various factors such as the size of the anchor structure, the depth of the anchor structure, the particular adhesive utilized, and the area of the flexible circuit over which pressure is applied. In addition, the height tolerance of the flexible circuit above the die carrier or the tolerance associated with any runout or bulging (i.e. "splash out") beyond the edges (i.e. lateral surfaces) of the flexible circuit will depend on various factors including the temperature, pressure, and mass of adhesive utilized to form attaching adhesive layer 170. Adhesive anchor 171 forms a mechanical anchor that provides additional mechanical strength to the bond formed between chip carrier 120 and flexible circuit 140. The utilization of adhesive anchor 171 allows for the advantageous use of lower cost adhesives and a wider variety of adhesives, including the use of more brittle higher modulus adhesives that generally are not used because of the weaker adhesive strength for those adhesives between the adhesive and the flexible circuit compared to some lower modulus adhesives. In addition, the utilization of adhesive anchors 171 also allows for the use of lower as well as moderate modulus adhesives that generally have weaker adhesive strength between the adhesive and the flexible circuit. In the embodiment shown in FIG. 1d, attaching adhesive layer 170 extends beyond the edges or lateral surfaces of flexible circuit 140; however, in alternate embodiments the adhesive layer or bead can be wider or narrower than the flexible circuit. For example, in those applications where the height of the adhesive at the edge of the flexible circuit may hinder operation of the device the adhesive layer may be narrower than the width of the flexible circuit.

Figure 1F:
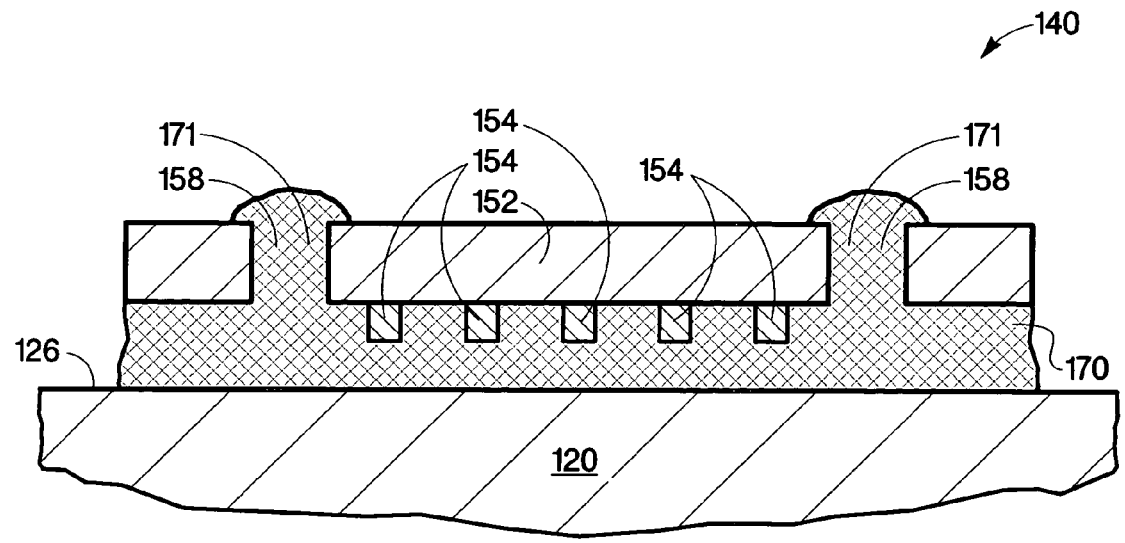
FIG. 1f is a cross-sectional view of the flexible circuit shown in FIG. 1c adhesively attached to a chip carrier according to an alternate embodiment of the present invention.
Figure 1G:
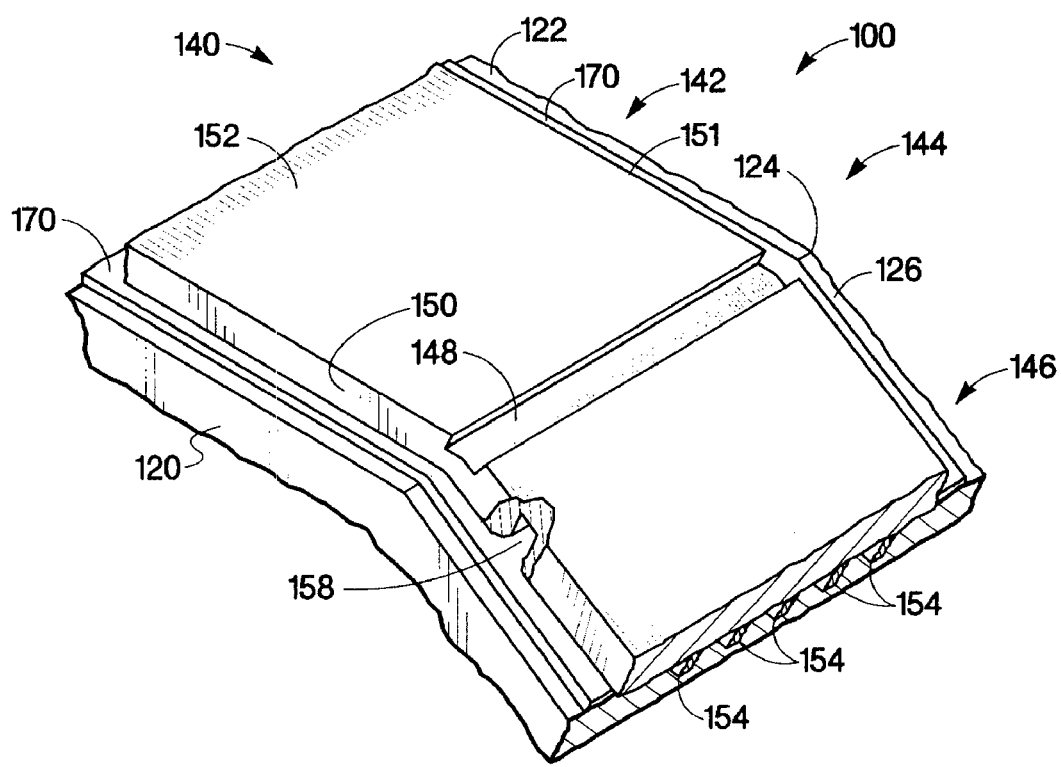
FIG. 1g is a perspective view of a flexible circuit and chip carrier according to an alternate embodiment of the present invention.

An alternate embodiment is shown, in a cross-sectional view, in FIG. 1f. In this embodiment, anchor structures 158 form anchor holes that extend through flexible structure 140. In this embodiment, chip carrier 120 includes second surface 126 to which flexible circuit 140 is adhesively attached via attaching adhesive layer 170. Flexible circuit 140 includes conductive lines 154 attached to first insulative or dielectric layer 152. Flexible circuit 140 is urged toward attaching adhesive layer 170 causing adhesive to flow into and through the holes forming anchor structure 158 to form adhesive anchor 171. Still another alternate embodiment of the present invention is illustrated, in a perspective view, in FIG. 1g. In this embodiment, flexible circuit 140 includes bending region 144 having thinned region 148 formed therein. Bending portion 144 is bent around carrier edge 124 such that thinned region 148 is at least proximate to or directly over carrier edge 124 of chip carrier 120. As described earlier for the embodiment shown in FIG. 1d, flexible circuit 140 includes first portion 142 that is adhesively attached or mounted to first surface 122 of chip carrier 120 via attaching adhesive layer 170. Flexible circuit 140 also includes second portion 146 that is adhesively attached or mounted to second surface 126 of chip carrier 120 via attaching adhesive layer 170. In this embodiment, thinned region 148 extends substantially from first circuit edge 150 to second circuit edge 151, and provides a substantial increase in flexibility and a corresponding decrease in stress in the bending portion of flexible circuit 140. Thinned region 148 may be formed in flexible circuit 140 by a wide variety of techniques including laser ablation, chemical etching, ion milling, and mechanically just to name a few techniques. For example, for those embodiments where the insulative material, in which the thinned region is to be formed, contains aromatic compounds laser ablation may be utilized. Another example is the use of chemical etching by a strong base such as potassium or sodium hydroxide in those embodiments where the insulative material is a polyimide. Mechanical scoring and ion milling also can be utilized in a wide variety of materials. In addition, although the embodiments shown in FIGS. 1a-1g illustrate anchor structures 158 formed in second portion 146 of flexible circuit 140, it should be understood that in alternate embodiments anchor structures 158 also may be formed in first portion 142 of the flexible circuit.

Figure 2A:
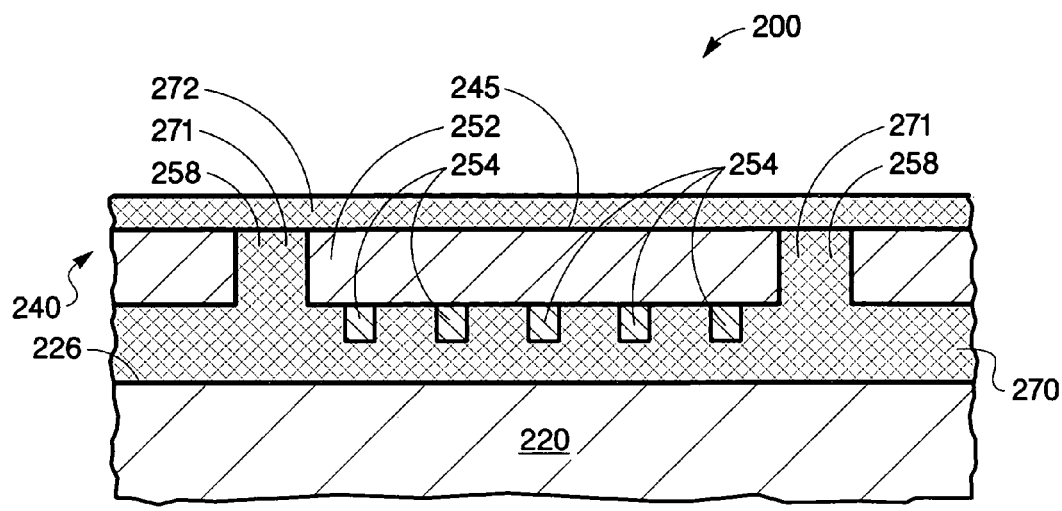
FIG. 2a is a cross-sectional view of a portion of a flexible circuit and a portion of chip carrier according to an alternate embodiment of the present invention.

An alternate embodiment of an electronic apparatus employing the present invention is illustrated, in a cross-sectional view, in FIG. 2a. In this embodiment, electronic apparatus 200 includes flexible circuit 240 having anchor holes 258 extending through first insulative or dielectric layer 252 in the second portion of the flexible circuit. Flexible circuit 240 also includes conductive lines 254 attached to first insulative or dielectric layer 252. The second portion of the flexible circuit is adhesively attached or mounted, via attaching adhesive layer 270, to second surface 226 of chip carrier 220. Adhesive anchor film 272, in this embodiment, is disposed on external surface 245 of first insulative layer 252. In this embodiment, adhesive anchor film 272 and attaching adhesive layer 270 are formed from the same material; however, in alternate embodiments, different adhesive materials also may be utilized. In this embodiment, adhesive anchor layer 272 is disposed over a substantial portion of the first insulative layer between the anchor holes; however, in alternate embodiments adhesive anchor film 272 may be disposed in a wide variety of shapes and regions. Examples include various shaped discreet portions such as circular, square, or rectangular shaped portions that essentially cover the anchor holes or strips that cover two or more holes. During the bonding process attaching adhesive layer 270 and adhesive anchor film 272 are heated to at least their softening temperature (i.e. a temperature sufficient for the adhesive to exhibit flow at reasonable pressures). Utilizing a release layer disposed between a pressure applying device and the adhesive anchor film the flexible circuit is urged toward attaching adhesive layer 270. In this embodiment the applied pressure causes adhesive from adhesive anchor film 272, as well as adhesive from attaching adhesive layer 270 to flow into anchor holes 258 to form adhesive anchor 271 as shown in a cross-sectional view in FIG. 2a. The particular temperature and pressure utilized will depend on various factors such as the size of the anchor hole, the thickness of the flexible circuit, the particular adhesive utilized, and the area of the flexible circuit over which pressure is applied. In an alternate embodiment, the adhesive anchor film may be omitted and additional adhesive may be added from flexible circuit external surface 245 to the anchor holes and either urged into the anchor holes or allowed to flow into the anchor holes to form adhesive anchor 271 along with adhesive from attaching adhesive layer 270. Adhesive anchor 271 forms a mechanical anchor that provides additional mechanical strength to the bond formed between chip carrier 220 and flexible circuit 240.

Figure 2B:
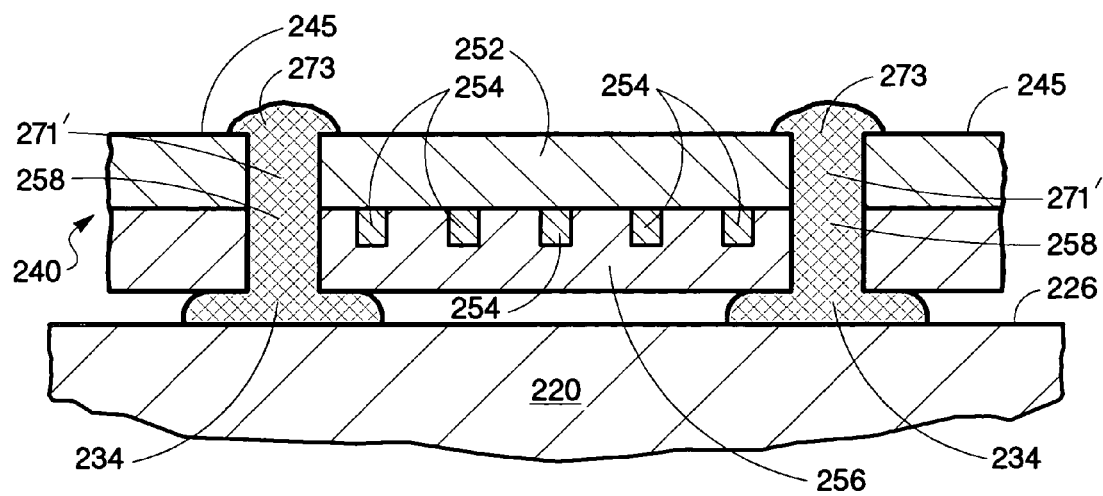
FIG. 2b is a cross-sectional view of a portion of a flexible circuit and a portion of chip carrier according to an alternate embodiment of the present invention.
Figure 2C:
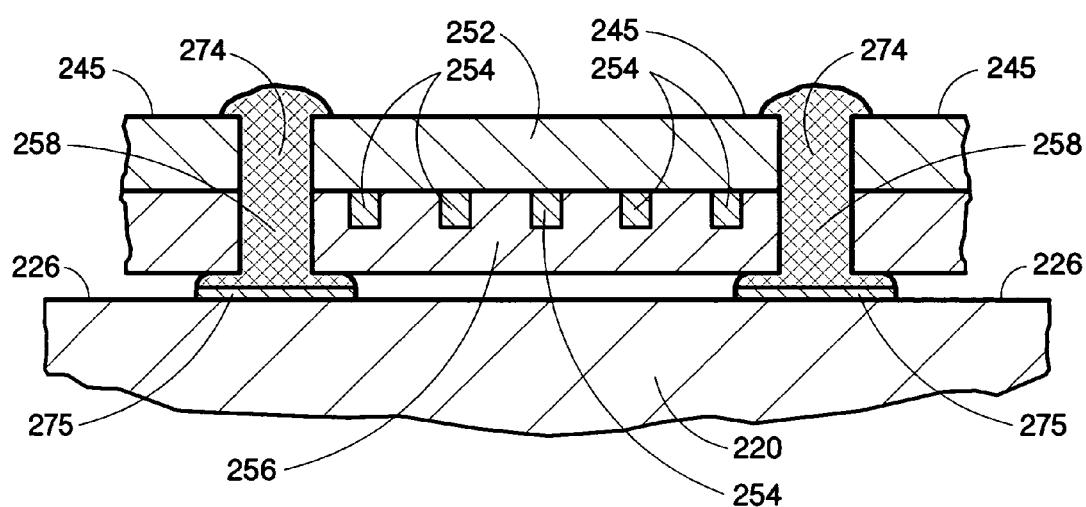
FIG. 2c is a cross-sectional view of a portion of a flexible circuit and a portion of chip carrier according to an alternate embodiment of the present invention.

An alternate embodiment of an electronic apparatus employing the present invention is illustrated, in a cross-sectional view, in FIG. 2b. In this embodiment, die carrier adhesive bead 234 is dispensed along second surface 226 of die carrier 220 in the region where anchor holes will be position when flexible circuit 240 is adhesively attached to the die carrier. In addition, flex circuit adhesive bead 273 is dispensed along external surface 245 of first insulative layer 252 of flexible circuit 240. As the flexible circuit is urged toward the die carrier adhesive from adhesive beads 273 and 234 will flow into anchor holes 258 forming adhesive anchor 271'. In this embodiment, anchor holes 258 extend through first insulative or dielectric layer 252 and second insulative or dielectric layer 256 with electrical conductors 254 sandwiched therebetween.

Figure 2D:
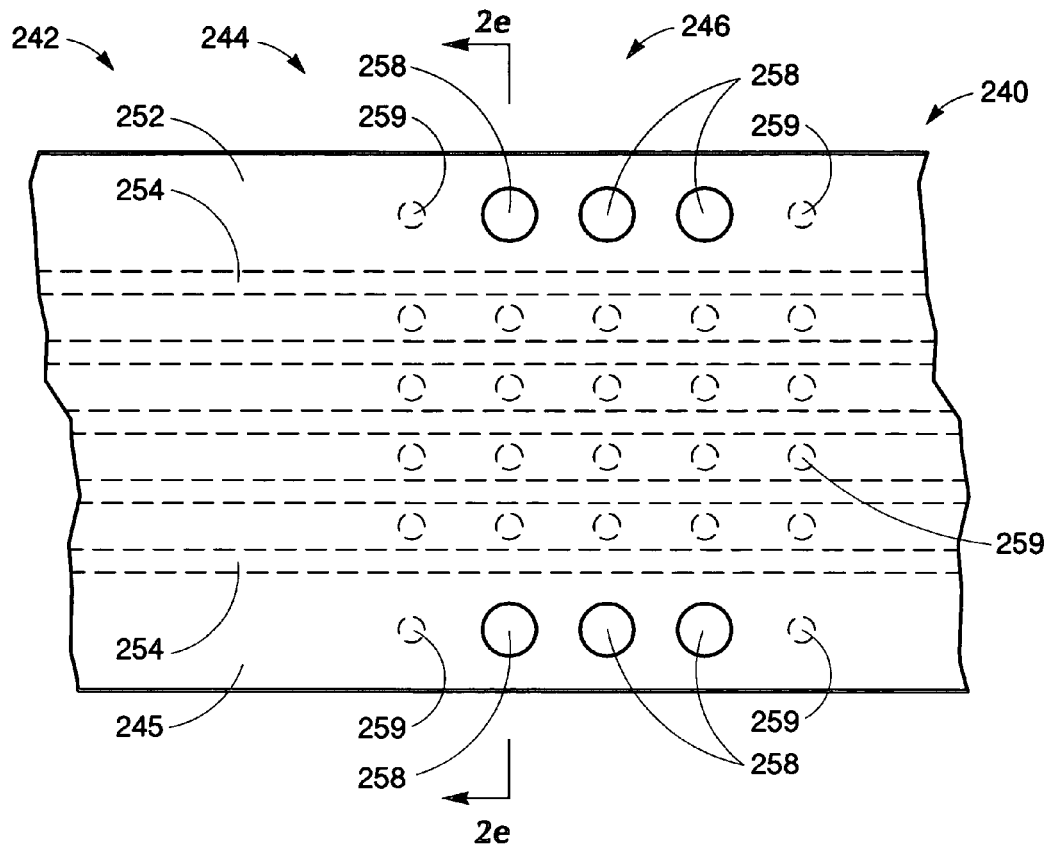
FIG. 2d is a top plan view of a portion of a flexible circuit according to an embodiment of the present invention.
Figure 2E:
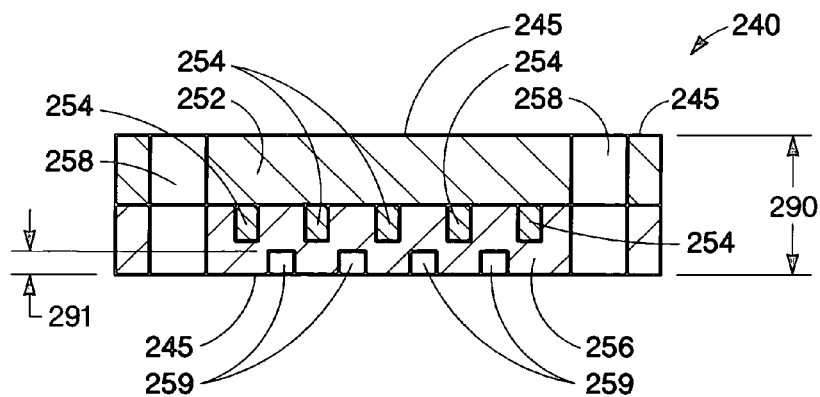
FIG. 2e is a cross-sectional view along 2e-2e of the flexible circuit shown in FIG. 2d.

In still another embodiment, anchor holes 258 may be aligned with and disposed over solder pads 275 formed on second surface 226 of die carrier 220 as illustrated in a cross-sectional view in FIG. 2d. In this embodiment, solder forms solder anchor 274 acting as a mechanical anchor. In addition, in this embodiment anchor holes 258, that extend through first and second insulative layers 252 and 256, may form a through hole structure having metal formed (not shown), via plating or some other appropriate technique, on the inside surface of the anchor hole to facilitate wetting of the solder. In addition, a small region on external surface 245 of first insulative layer 252 surrounding or encircling anchor holes 258 also may have metal formed thereon to facilitate wetting of the solder. In this embodiment, anchor holes 258 extend through first insulative or dielectric layer 252 and second insulative or dielectric layer 256 with electrical conductors 254 sandwiched therebetween.

An alternate embodiment of a flexible circuit that may be utilized in the present invention is shown in a top plan view in FIG. 2d. In this embodiment, flexible circuit 240 includes multiple first anchor structures 258 and multiple second anchor structures 259 formed in second portion 246. First anchor structures 258 form anchor holes extending through first and second insulative layers 252 and 256 (i.e. from attaching surface 243 to external surface 245) as illustrated, in a cross sectional view, in FIG. 2e. First anchor structures, 258 in this embodiment are circular shaped holes; however, in alternate embodiments any of a wide variety of various shaped holes and/or recessed regions also may be utilized. First anchor structures have a first diameter, width, opening area, or some combination thereof and have first depth 290. Second anchor structures 259, in this embodiment, are also circular shaped recessed regions having a second diameter, width, opening area, or some combination thereof and second depth 291 formed in attaching surface 243 of second insulative layer 256. In this embodiment, the first diameter and first depth 290 of the first anchor structures are greater than the second diameter and second depth 291 of the second anchor structures. However, in alternate embodiments, a wide variety shapes and diameters or widths as well as depths may be utilized to form both the first and second anchor structures. In addition, although the embodiment shown in FIGS. 2d and 2e utilizes a second insulative layer in alternate embodiments the first and second anchor structures also may be formed in the attaching surface of the first insulative layer. In addition, although the embodiments shown in FIGS. 2a-2e illustrate first anchor structures 258 and second anchor structures 259 formed in second portion 246 of flexible circuit 240, it should be understood that in alternate embodiments the first and second anchor structures also may be formed in first portion 242 of the flexible circuit.

In the embodiments shown in FIGS. 1 and 2 the chip carrier may be formed from a wide variety of materials including various inorganic, polymeric materials, and mixtures thereof. Examples of materials that may be utilized to form chip carrier include ceramic materials such as alumina, metals such as aluminum including anodized aluminum, glasses such as borosilicate or quartz and semiconductors such as silicon as well as composite materials such as FR-4 board. Examples of polymeric materials include polyimides, polycarbonates, epoxies, benzocyclobutenes, polymethylmethacrylates, phenolics, and urethanes. In addition, the first and second insulative layers of the flexible circuit also may be formed from a wide variety of polymeric materials. Non-limitative examples include polyimides, polyesters (PET), polyethylene naphthalate (PEN), polybutylene terephthalate (PBT), polypropylene (PP), polyethylene (PE), polyamide, polyester based liquid-crystal polymers, as well as various thermoplastic and thermosetting adhesive materials to name a few. Further, the adhesives utilized to form the anchor structures may include a wide variety of adhesive materials. Non-limitative examples include one and two part epoxies, acrylics, and various hot melt adhesives such as urethanes.

A fluid ejection cartridge employing the present invention is illustrated in FIGS. 3a-3d. In this embodiment, fluid ejection cartridge 302, shown in a perspective view, in FIG. 3a, includes reservoir 381 that contains a fluid which is supplied to fluid ejector die 331 (see FIGS. 3b and 3c) that is secured to the back of nozzle layer 317 via a chamber definition layer. The fluid ejector die, nozzle layer 317, nozzles 311, and flexible circuit 340 form what is generally referred to as an ejector head 304. In those embodiments which do not utilize an integrated nozzle layer and flexible circuit, the fluid ejector die, the nozzle layer, and the nozzles would generally be referred to as the ejector head.

Nozzle layer 317 contains one or more nozzles 311 through which fluid is ejected. Nozzle layer 317 may be formed of metal, polymer, glass, or other suitable material such as ceramic. In the embodiment shown in FIGS. 3a-3c nozzle layer 317 is formed from a polymer such as polyimide, polyester, or polyethylene naphthalate (PEN). Examples of commercially available nozzle layer materials include a polyimide film available from E. I. DuPont de Nemours & Co. under the name "Kapton", a polyimide material available from Ube Industries, LTD (of Japan) under the name "Upilex". Nozzles 311 are formed by any of a wide variety of techniques, such as laser ablation, plasma etching, mechanical punching, chemical etching, or combinations thereof. In an alternate embodiment, nozzle layer 317 is formed from a metal such as a nickel base enclosed by a thin gold, palladium, tantalum, or rhodium layer.

Figure 3A:
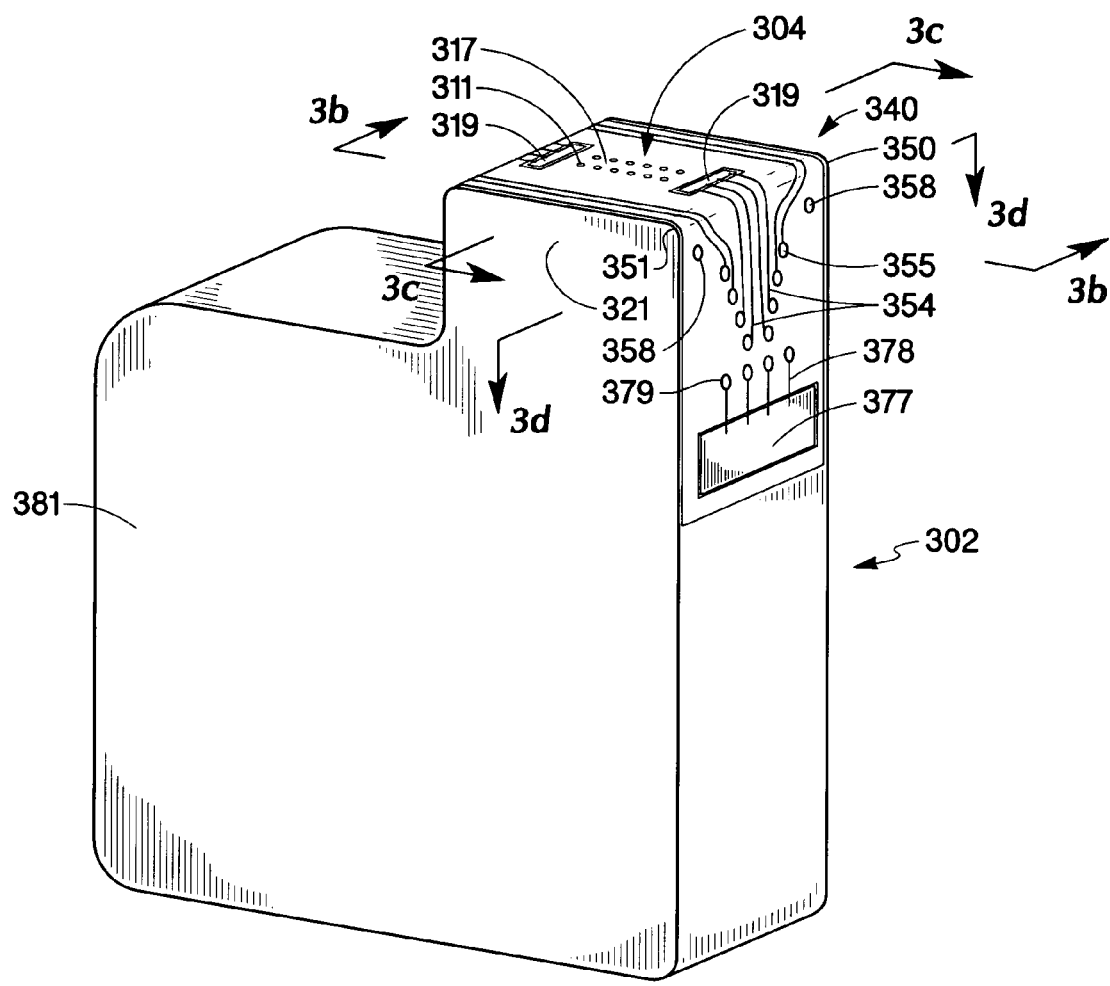
FIG. 3a is a perspective view of a fluid ejection cartridge according to an embodiment of the present invention.
Figure 3B:
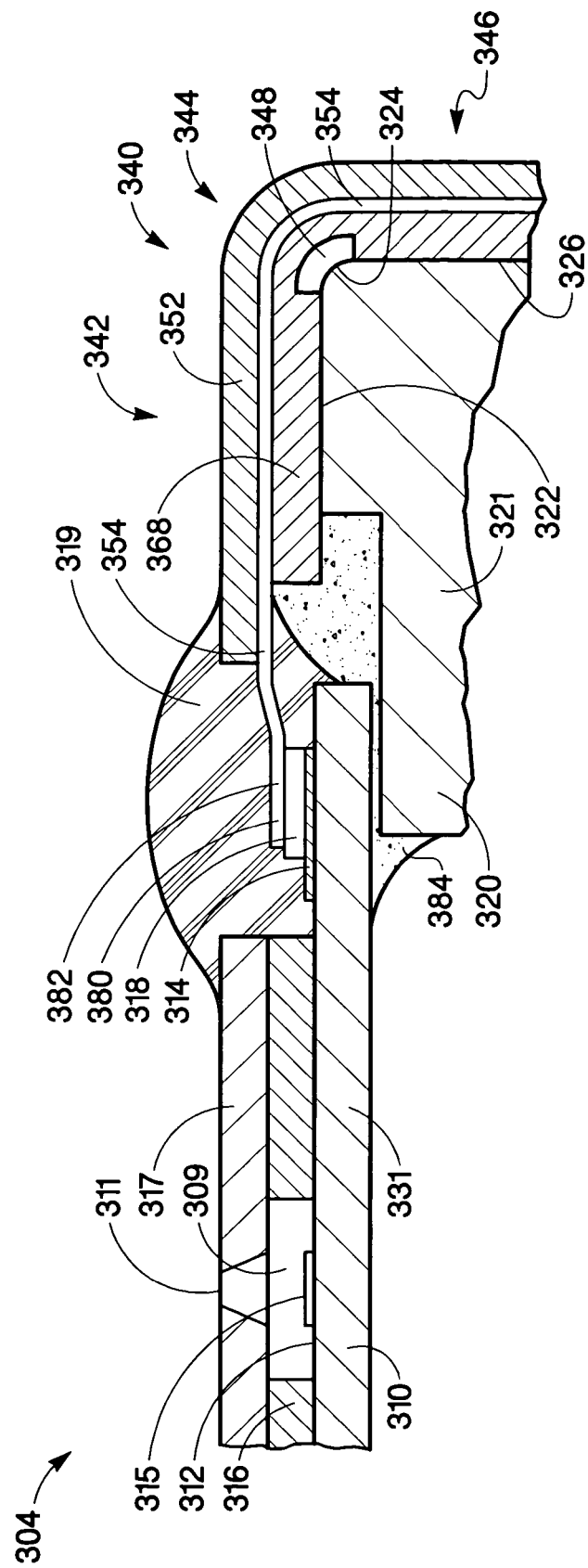
Figure 3C:
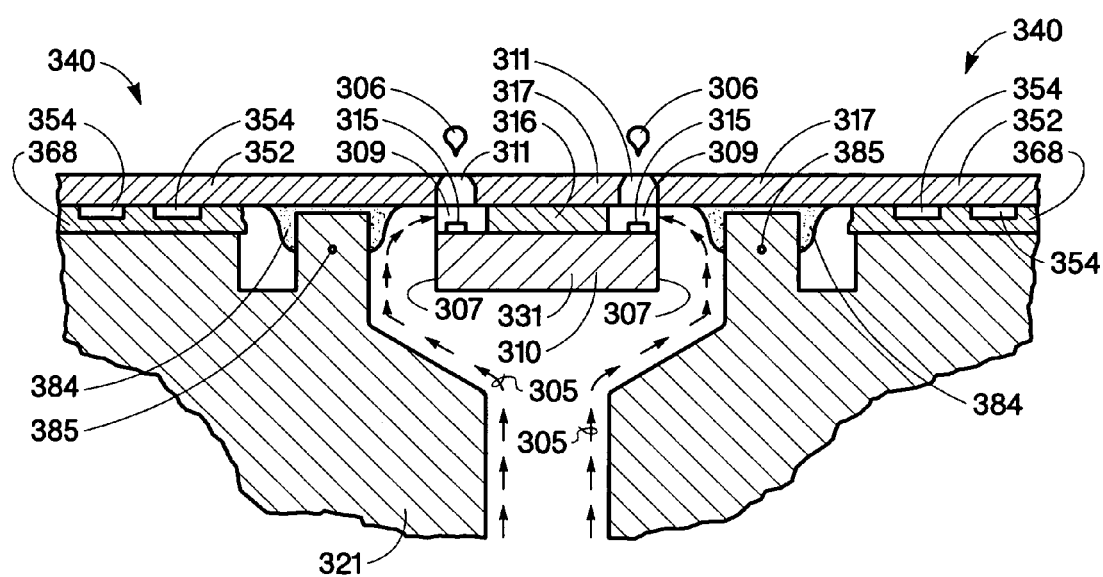
Figure 3D:
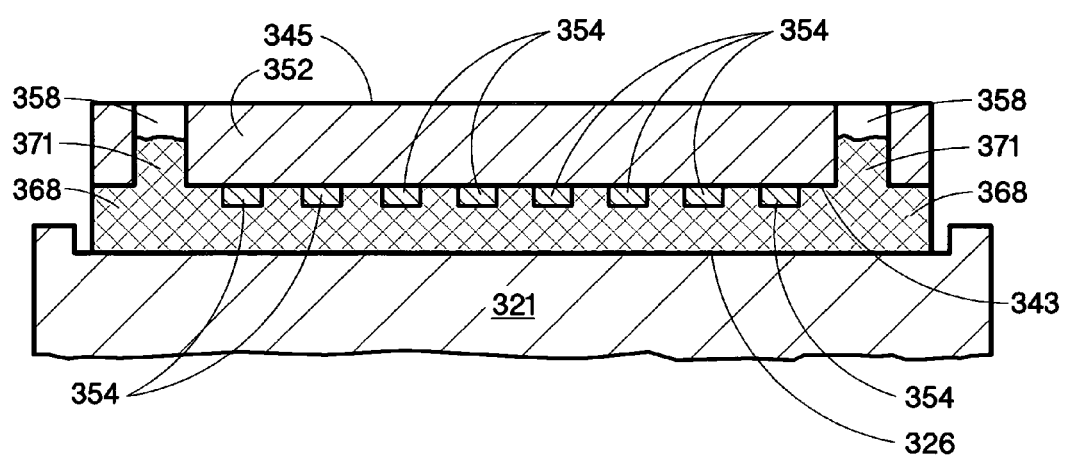

Flexible circuit 340, in this embodiment, is a polymer film and includes electrical traces 354 connected to electrical contacts 355. Electrical traces 354 are routed from electrical contacts 355 to bond pads 318 (see FIGS. 3b) on the fluid ejector die to provide electrical connection for fluid ejection cartridge 302. When the flexible circuit and the nozzle layer are integrated as shown in FIGS. 3a-3c, raised encapsulation beads 319 (typically an epoxy) are dispensed within a window formed in the integrated flexible circuit 340 and nozzle layer 317. Encapsulation beads 319 protect and encapsulate electrical traces 354 and bond pad electrical connections 380 (see FIG. 3b) on fluid ejector die 331. In an alternate embodiment, when nozzle layer 317 is not integrated into flexible circuit 340 the encapsulation beads are dispensed along the edge of the nozzle layer and the edge of substrate 310 (see FIGS. 3b-3c) that forms fluid ejector die 331 to provide the protection function for the electrical connections to the substrate.

In this embodiment, flexible circuit 340 also includes coverlayer 368 that is heat staked to fluid ejection body 321 providing an adhesive function to attach flexible circuit 340 to fluid ejection body 321 as well as providing environmental protection of electrical traces 354. In this embodiment, coverlayer 368 is a three-layer laminate with a 1.5 mil ethyl vinyl acetate (EVA), a 0.5 mil polyethylene terephthalate (PET) layer, and a 1.5 mil ethyl vinyl acetate layer. EVA is a thermoplastic material, which reflows upon heating and bonds to fluid ejection body 321. The PET film acts as a carrier layer that allows mechanical punching and handling of coverlayer 368 without excessive stretching. Under heat and pressure the EVA flows to fill in the spaces between the conductive traces. In some applications a single layer can also be utilized such as a single layer of EVA, polyolefin, or acrylic acid copolymers to name a few.

In this embodiment, fluid ejection body 321 includes rounded cartridge edge 324 that is formed at the intersection of first fluid ejection body surface 322 and second fluid ejection body surface 326 as shown in FIG. 3b. Flexible circuit 340 also includes first flex circuit portion 342 that is adhesively mounted via coverlayer 368 to first fluid ejection body surface 322. In addition, thinned region 348 is formed in coverlayer 368 in edge portion 344 of flexible circuit 340; and second flex circuit portion 346 is adhesively attached via coverlayer 368 to second fluid ejection body surface 326. Thinned region 348 extends substantially from first circuit edge 350 (see FIG. 3a) to second circuit edge 351 (see FIG. 3a). Thinned region 348 provides a substantial increase in flexibility as well as a decrease in stress in the vicinity of edge portion 344 of flexible circuit 340. In alternate embodiments thinned region 348 may be omitted depending on the particular application in which fluid ejection cartridge 302 is utilized. In addition, as illustrated, in a cross-sectional view, in FIG. 3d, flexible circuit 340 also includes anchor holes 358 extending from attaching surface 343 to external surface 345 of first insulative layer 352. During heat staking of the flexible circuit to fluid ejection cartridge body 321 adhesive from cover layer 368 flows into anchor holes 358 and forms adhesive anchors 371.

Information storage element 377 is disposed on cartridge 302 as shown in FIG. 3a. In this embodiment, information storage element 377 is electrically coupled to flexible circuit 340. Information storage element 377 is any type of memory device suitable for storing and outputting information that may be related to properties or parameters of the fluid or fluid ejector head. Typically, information storage element 377 is a memory chip mounted on flexible circuit 340 and electrically coupled through electrical traces 378 to electrical contacts 379. Alternatively, information storage element 377 can be encapsulated in its own package with corresponding separate electrical traces and contacts. When fluid ejection cartridge 302 is either inserted into, or utilized in, a dispensing system information storage element 377 is electrically coupled to a controller that communicates with information storage element 377 to use the information or parameters stored therein. However, other forms of information storage also may be utilized for the information storage element, such as a bar code or other device that allows storage of information.

A cross-sectional view of fluid ejector head assembly 304 is shown in FIG. 3b showing encapsulation bead 319, such as an epoxy bead, providing mechanical support and environmental protection, such as moisture and corrosion protection to electrical interconnection 380 and bond pad 318. Substrate 310 has fluid ejector 315 formed on active surface 312. In this embodiment, fluid ejector 315 is a thermal resistor; however, other fluid ejectors also may be utilized such as piezoelectric, flex-tensional, acoustic, and electrostatic. In addition, substrate 310 or fluid ejector die 331, in this embodiment, includes one or more transistors or other logic devices (not shown) formed on substrate 310; however, "direct drive" structures also can be utilized. In a direct drive application each fluid ejector is electrically connected to a bond pad. Chamber layer 316 forms fluidic chamber 309 around fluid ejector 315 so that when fluid ejector 315 is activated fluid is ejected out of nozzle 311, which is generally located over fluid ejector 315. Fluid 305 flows around edges 307 of substrate 310 (see FIG. 3c) providing a fluidic path for fluid 305 in reservoir 381 (see FIG. 3a) to fill fluidic chamber 309.

As shown in FIGS. 3b and 3c, nozzle layer 317 is formed over chamber layer 316. However, in alternate embodiments, a photodefinable polymer can be used to form both nozzle layer 317 and chamber layer 316. For example, a photodefinable polyimide, benzocyclobutene, or epoxy such as a photoimagible epoxy available from MicroChem Corp. under the name NANO SU-8 can be utilized. Dielectric layer 314 is formed over at least a portion of substrate 310, providing electrical isolation for one or more bond pads 318. In this embodiment, substrate 310 is a silicon integrated circuit including transistors and other logic devices (not shown), however, materials such as germanium, gallium arsenide, amorphous silicon, aluminum oxide, polysilicon, and other substrates that support active and passive devices can also be utilized. Dielectric layer 314 and bond pad 318 are generally formed utilizing conventional semiconductor equipment.

Flexible circuit 340 includes base film 352 and electrical traces 354 as shown in FIGS. 3b and 3c. Generally, base film is formed from a polymer such as polyimide, such as Kapton or Upilex, polyester, or polyethylene naphthalate (PEN) to name just a few examples. Flexible circuit 340 is formed utilizing techniques such as conventional photolithographic etching, metal deposition, electroless processes, and electroplating processes. Electrical interconnection 380, in this embodiment, is formed utilizing a conventional TAB (tape automated bonding) bonder, such as an inner lead bonder commercially available from Shinkawa Corporation. The bonder applies heat and pressure to electrical trace end 382 pressing trace end 382 onto bond pad 318 through the opening formed by the end of nozzle layer 317 and the end of base film 352 forming a thermocompression bond. Other types of bonding can also be utilized, such as wire bonding, ultrasonic bonding, conductive adhesive, solder paste, or other electrical bonding technologies.

Structural adhesive 384 is dispensed around the periphery of the ends of substrate 310 providing both a method of attachment and a fluid seal between substrate 310 and fluid ejection chip carrier 320 of fluid ejection body 321 as shown in FIG. 3b. In FIG. 3c, structural adhesive 384 is shown applied to inner raised walls 385 of fluid ejection body 321 forming an additional portion of the fluid seal. In this embodiment structural adhesive 384 is a thermally cured epoxy, however, other adhesives such as hot melts, silicones, UV curable adhesives, and various film adhesives also can be utilized. Fluid ejection body 321 including fluid ejection chip carrier 320, in this embodiment, is formed by injection molding.

In this embodiment, fluid 305 from fluid reservoir 381 (see FIG. 3a) flows around edges 307 of substrate 310 and into fluid chamber 309 as shown in a cross-sectional view in FIG. 3c. When fluid ejectors 315 are activated, fluid over the fluid ejectors 315 is ejected out of nozzles 311 as illustrated by drops 306. Fluid channel layer 316, is bonded to nozzle layer 317 through a heat staking process, however, a thin adhesive layer between nozzle layer 317 and fluid channel layer 316 also may be utilized as well as other mechanical techniques. In addition, a portion of flexible circuit 340 is heat staked via coverlayer 368 to plastic fluid ejection body 321 as shown in FIG. 3c.

Figure 4A:
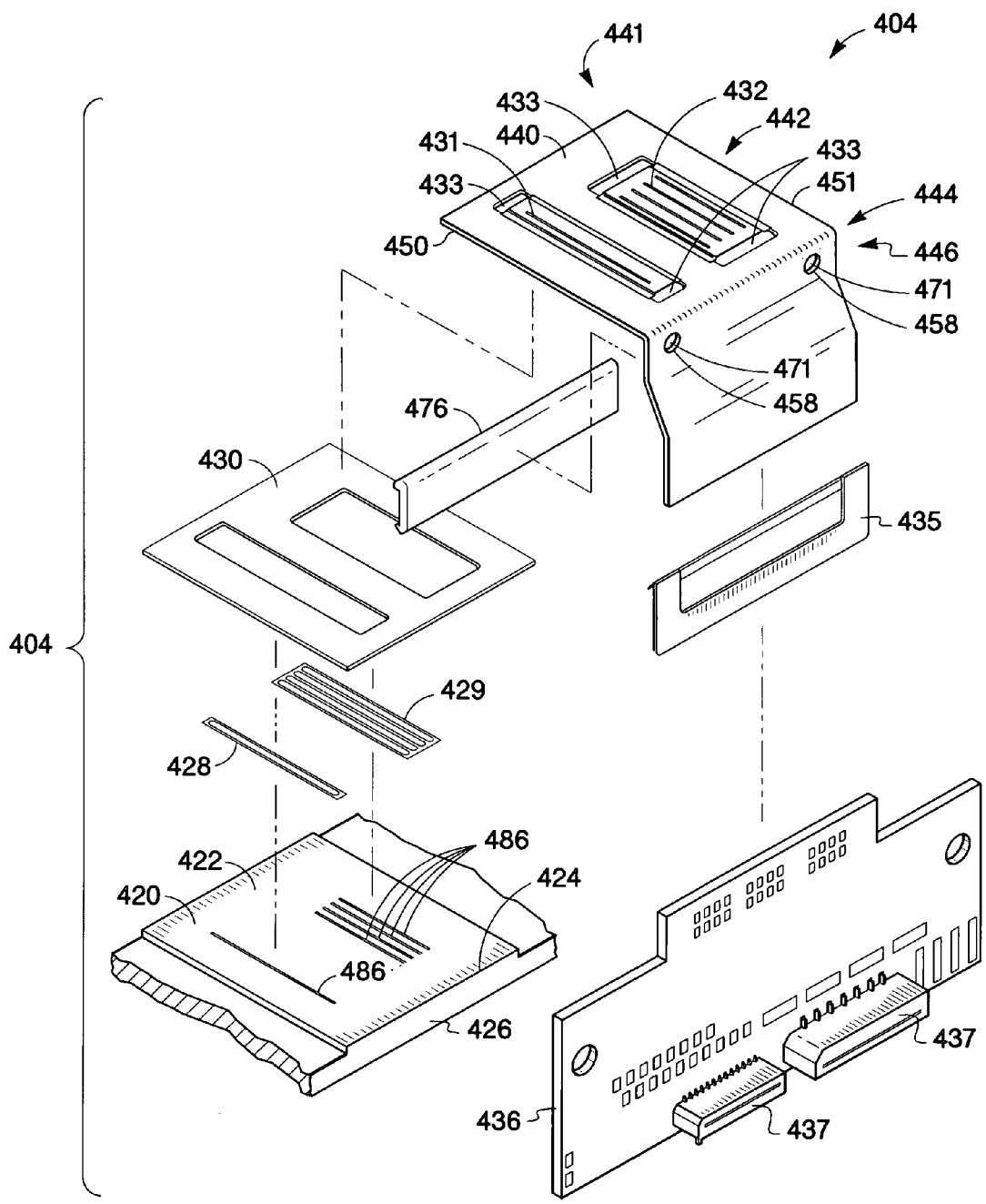
FIG. 4a is an exploded isometric perspective view of a fluid ejection printhead according to an embodiment of the present invention
Figure 4B:
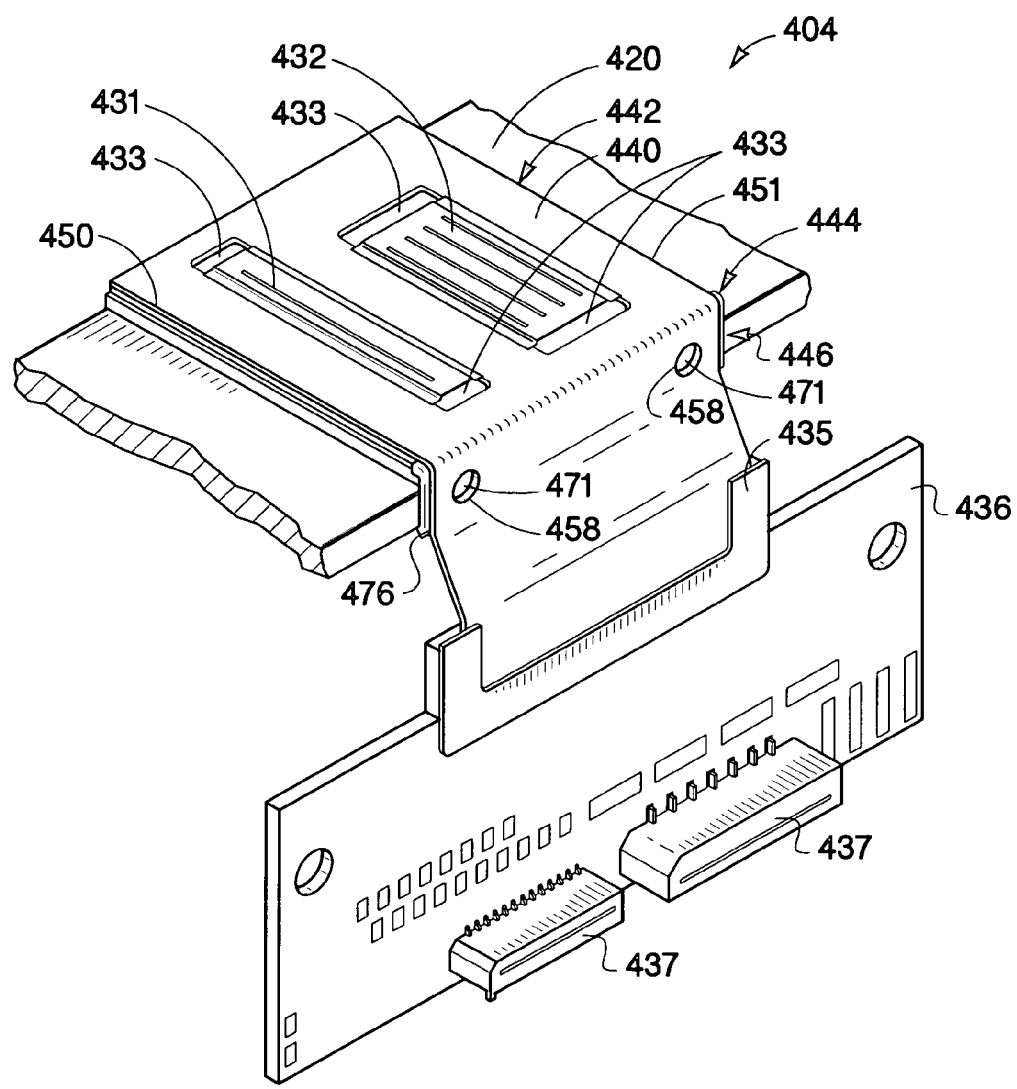

An exemplary embodiment of a fluid ejector head employing the present invention is illustrated in FIGS. 4a and 4b. In this embodiment, fluid ejector head 404 shown, in FIG. 4a, in an exploded perspective view, includes die chip carrier 420 having fluid channels 486 formed therein for routing fluid from one or more reservoirs to fluid ejector actuators disposed on fluid ejector die 431 and 432. In this embodiment, die chip carrier 420 has 5 fluid channels; however, in alternate embodiments any number of fluid channels (i.e. one or more) may be utilized depending on the specific application in which fluid ejector head 404 is used. In this embodiment, die chip carrier 420 is a ceramic die chip carrier; however in alternate embodiments a wide range of materials including metals, glasses, composite materials, polymeric materials, and combinations thereof also may be utilized. In addition, die chip carrier includes tight wrap edge 424 that is formed at the intersection of first chip carrier surface 422 and second chip carrier surface 426. In this embodiment, the angle formed between the surface normals of these two surfaces is ninety degrees; however, in alternate embodiments, an angle greater than about 45 degrees also may be utilized. The present invention is particularly advantageous for those applications utilizing an angle greater than about 70 degrees.

In addition, fluid ejector head 404 also includes fluid ejector head assembly 441 disposed over die chip carrier 420. Fluid ejector head assembly 441 includes flexible circuit 440 and, first and second fluid ejector die 431 and 432 disposed in openings formed in flexible circuit 440. Although two fluid ejector die are shown in FIGS. 4a and 4b, it should be understood that any number of fluid ejector die may be utilized depending on the particular application in which fluid ejector head 404 is used. Electrical connections between first and second fluid ejector die 431 and 432 and flexible circuit 440, in this embodiment, are made via TAB bonding copper leads formed on the flexible circuit to bond pads formed on the first and second fluid ejector die as previously discussed and shown in the embodiments shown in FIGS. 3a-3c. However, in alternate embodiments, other types of bonding such as wire bonding, ultrasonic bonding, conductive adhesive, solder paste, or other electrical bonding technologies can also be utilized. Encapsulation beads 433 provide mechanical and environmental protection of the electrical connections formed between the first and second fluid ejector die and the flex circuit. First and second fluid ejector die 431 and 432 are aligned to fluid channels 486 and adhesively mounted to first chip carrier surface 422 of die chip carrier 420 via die attach film adhesives 428 and 429 respectively. Die attach film adhesives 428 and 429, in this embodiment, are epoxy film adhesives, however, in alternate embodiments a wide range of both film and dispensed adhesives also may be utilized. In this embodiment, first fluid ejector die 431 is a silicon semiconductor chip configured to eject black ink and second fluid ejector die 432 is a silicon semiconductor chip configured to eject four inks, such as, cyan, yellow, magenta, and black. In alternate embodiments, virtually any combination of fluid ejector die and fluids, that are adaptable to drop-wise ejection, may be utilized. In the embodiment shown in FIG. 4a, flexible circuit adhesive 430 is disposed between flexible circuit 440 and die chip carrier 420 and provides adhesion of flexible circuit 440 to die chip carrier 420. In addition, generally, flexible circuit adhesive 430 includes a thick core layer (not shown) that also provides for the difference in thickness between the flexible circuit and the first and second fluid ejector die so that flexible circuit 440 remains substantially planar after mounting fluid ejector head assembly 441 to die chip carrier 420. In alternate embodiments, the thickness of flexible circuit adhesive 430 may be varied including eliminating the thick core layer by utilizing a die chip pocket (not shown) formed in die chip carrier 420, or various combinations an adhesive film and a die chip pocket. In this embodiment, the flexible circuit adhesive is a phenolic adhesive coated on a polyetherimide core layer. One particular polyetherimide core layer that may be utilized is available from General Electric Co. under the name "Ultem." In addition, other core layers that may be utilized include PBT, PET, PEN and polyetheretherketone (PEEK).

Fluid ejector head 404 also includes tight wrap adhesive 476 that provides adhesion of second portion 446 of flexible circuit 440 to second chip carrier surface 426 of die chip carrier 420 while first portion 442 of flexible circuit 440 is attached to first chip carrier surface 422 of die chip carrier 420. In FIG. 4a, tight wrap adhesive 476 is shown as a film for ease of illustration only. In this embodiment, tight wrap adhesive is an epoxy paste; however, in alternate embodiments a wide range of dispensable adhesive pastes as well as adhesive films also may be utilized. In addition, flexible circuit 440 further includes anchor structures 458 that extend through the flexible circuit and are formed in second portion 446. As previously described in other embodiments, during fabrication adhesive from tight wrap adhesive flows into anchor structures 458 to form adhesive anchors 471. Adhesive anchors 471 form a mechanical anchor that provides additional mechanical strength to the bond formed between chip carrier 420 and flexible circuit 440. The utilization of adhesive anchor 471 allows for the advantageous use of lower cost adhesives and a wider variety of adhesives, including the use of more brittle higher modulus adhesives that generally are not used because of the weaker adhesive strength for those adhesives between the adhesive and the flexible circuit compared to some lower modulus adhesives. In addition, the utilization of adhesive anchors 471 also allows for the use of lower as well as moderate modulus adhesives that generally have weaker adhesive strength between the adhesive and the flexible circuit.

The utilization of adhesive anchors 471 also provide more advantageous matching of adhesive to a particular application in which the fluid ejector head will be utilized. For example, in the inkjet printer application there is a demand by consumers for ever-increasing improvements in speed image quality and for longer lasting fluid ejector heads. Generally improvements in image quality have led to an increase in the complexity of ink formulations that increases the sensitivity of the ink to the ink supply and print cartridge materials that come in contact with the ink. Typically, these improvements in image quality have led to an increase in the organic content of inkjet inks, which results in a more corrosive environment experienced by the materials utilized; thus, raising material compatibility issues. By utilizing the adhesive anchors, adhesives that generally provide a weaker bond strength between the adhesive and the flexible circuit but are more robust or inert to the particular fluid or ink to be used, may be utilized in the present invention compared to stronger bond strengths obtained with other adhesives that are not as robust or inert. Thus the present invention provides for increased reliability in a wide variety of fluid ejector devices such as MEMS devices and inkjet printheads and cartridges.

In this embodiment, fluid ejector head 404 is disposed within a printing system (not shown) that includes a printer mechanism (not shown), a carriage drive mechanism (not shown) and a fluid ejector controller (not shown). Tight bend region 444, in this embodiment, has a bending radius of about 0.5 millimeters; however, in alternate embodiments, a bending radius in the range from about 0.1 millimeters to about 1 millimeter also may be utilized. The tight bending radius is utilized, in this embodiment, to substantially hinder interference between flexible circuit 440 of fluid ejector head 404 and the printer mechanism as the carriage drive mechanism translationally reciprocates or scans the fluid ejector head back and forth across the fluid receiving medium. This is particularly advantageous in inkjet printers where the ejector head to paper spacing affects print quality. Typically smaller ejector head to paper spacing is desirable. Therefore any failure by tight wrap film adhesive 476 to hold second portion 446 to second chip carrier surface 426 of die chip carrier 420 may cause interference between the slewing fluid ejector head (including the flexible circuit) and the printer mechanism. In addition, in alternate embodiments, anchor structures 458 as well as second anchor structures (not shown) also may be formed or fabricated in first portion 442 of the flexible circuit providing additional adhesive strength for the bond formed between first portion 442 and first chip carrier surface 422 of die chip carrier 420.

Fluid ejector head 404 further includes printed circuit assembly 436, which is soldered to flexible circuit 440. However, in alternate embodiments, other electrical interconnection schemes also may be utilized, such as various anisotropic conductive adhesives. Printed circuit assembly 436, in this embodiment, includes electrical traces for routing electrical power and electrical signals to fluid ejector die 431 and 432 via flexible circuit 440. Electrical connectors 437 provide electrical connection from the fluid ejection controller (not shown) to fluid ejector die 431 and 432. Printed circuit assembly adhesive 435 is disposed between flexible circuit 440 and printed circuit assembly 436 and substantially seals the electrical interconnections against fluid from the fluid ejector head. Printed circuit assembly adhesive 435, in this embodiment, is an epoxy film adhesive; however, in alternate embodiments other adhesives also may be utilized.

Figure 5A:
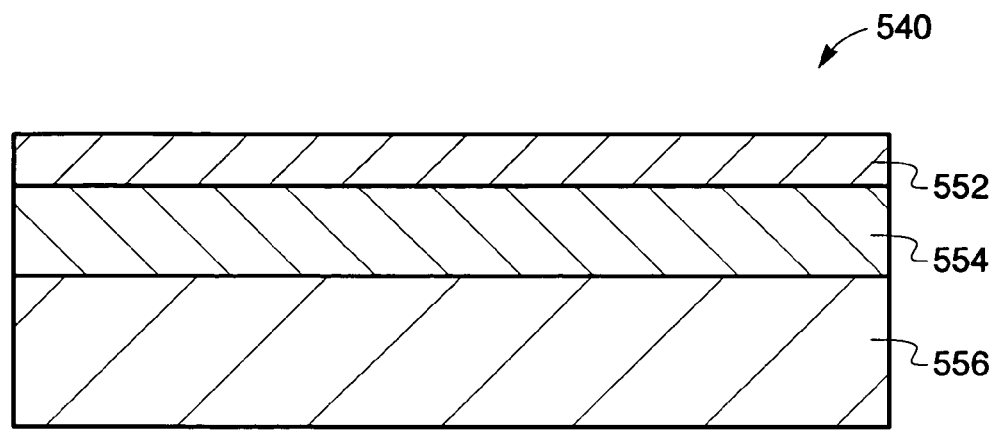
FIG. 5a is a cross-sectional view of a flexible circuit according to an embodiment of the present invention.
Figure 5B:
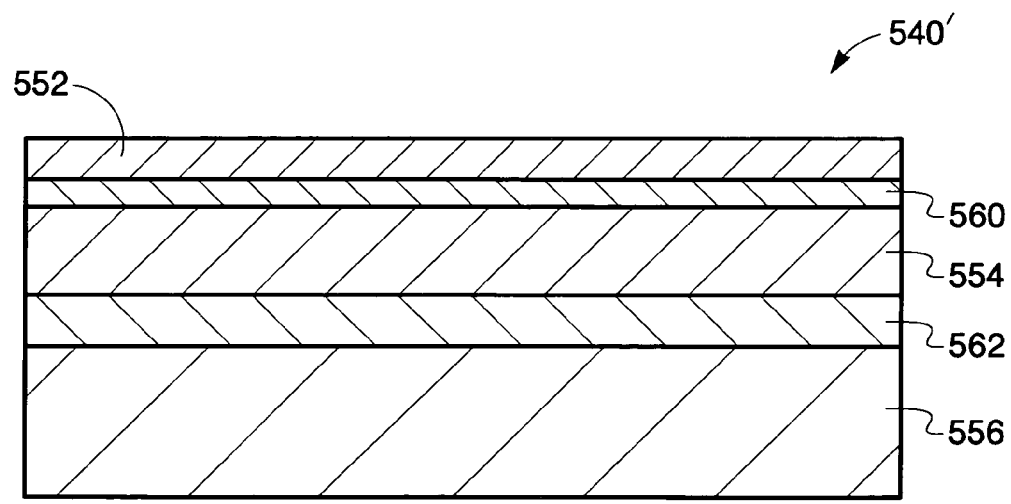
FIG. 5b is a cross-sectional view of a flexible circuit according to an alternate embodiment of the present invention.

Although a wide variety of flexible circuit structures may be utilized in the present invention FIGS. 5a and 5b illustrate, in cross-sectional views, two exemplary structures. In FIG. 5a what is commonly referred to as an adhesiveless flexible circuit is shown in a cross-sectional view. Flexible circuit 540 includes conductor traces 554 disposed between first and second insulative or dielectric layers 552 and 556. In this embodiment, first insulative layer 552 is a polyimide film available from E. I. DuPont de Nemours & Co. under the name "Kapton E" upon which conductor traces 554 are formed. Second insulative layer 556, in this embodiment, is an ethyl vinyl acetate (EVA) thermoplastic material that flows under heat and pressure to fill the spaces between the conductor traces 554; however, in alternate embodiments a wide range of other adhesives such as acrylic and epoxy adhesives available from Rogers Corporation also may be utilized. In addition, depending on the particular application in which flexible circuit 540 is utilized, second insulative layer 556 may also provide adhesion to the chip carrier to which it is attached. Conductor traces 554, in this embodiment, are electro deposited copper; however, in alternate embodiments, a wide range of conductive materials including other metals, alloys as well as inorganic and organic conductors also may be utilized. In addition, a wide variety of deposition techniques may also be utilized to deposit the conductor material including vapor deposition such as sputtering, evaporation, or chemical vapor deposition or combinations thereof, electroless plating followed by electroplating, as well as utilizing a conductor film or foil upon which the first and/or second insulative layers may be cast, laminated or otherwise brought into intimate contact with the conductor film.

In FIG. 5b an asymmetrical laminate structure is shown in a cross sectional view. In this embodiment, flexible circuit 540' includes conductor traces 554 adhesively attached to first insulative layer 552 via first adhesive layer 560 and, adhesively attached to second insulative layer 556 via second adhesive layer 562. In this embodiment, first insulative layer 552 is about 12.5 micrometers thick while second insulative layer 556 is about 50 micrometers thick. In addition, in this embodiment, conductor traces 554 are about 35 micrometers thick, first adhesive layer 560 is about 35 micrometers thick prior to lamination and after lamination first adhesive layer 560 has a thickness in the range from about 8 micrometers to about 12 micrometers, and finally second adhesive layer 562 is about 12 micrometers in thickness for a total thickness of about 118 micrometers. It should be understood that, in alternate embodiments, other thicknesses also may be utilized. In this embodiment, first and second insulative layers 552 and 556 are polyimide films available from Ube Industries, LTD (of Japan) under the name "Upilex S." First and second adhesive layers, in this embodiment are polyamide adhesives. An Example of a commercially available polyamide adhesive that may be utilized is available from Tomoegawa Paper Co., LTD (of Japan) under the name Tomoegawa-X. Examples of other adhesives that also may be utilized include acrylic adhesives available for example from E. I. DuPont de Nemours & Co. under the name "Pyralux," epoxy and polyimide adhesives available from Nippon Steel LTD (of Japan) under the name "Expanex." In addition, both acrylic and epoxy adhesives are also available from Rogers Corporation.

As discussed above for the embodiment shown in FIG. 5a, conductor traces 554, in this embodiment are electro deposited copper; however, in alternate embodiments a wide range of conductive materials and deposition techniques may be utilized to form the conductor traces.

Figure 5C:
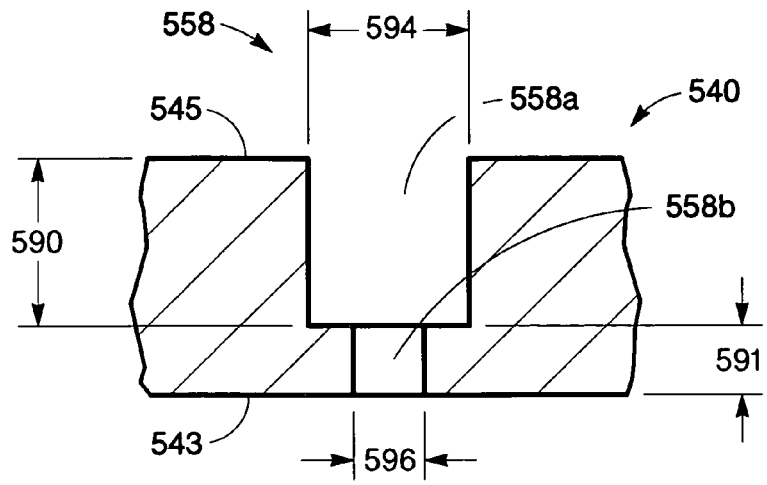
FIG. 5c is a cross-sectional view of an anchor structure formed in flexible circuit according to an embodiment of the present invention.
Figure 5D:
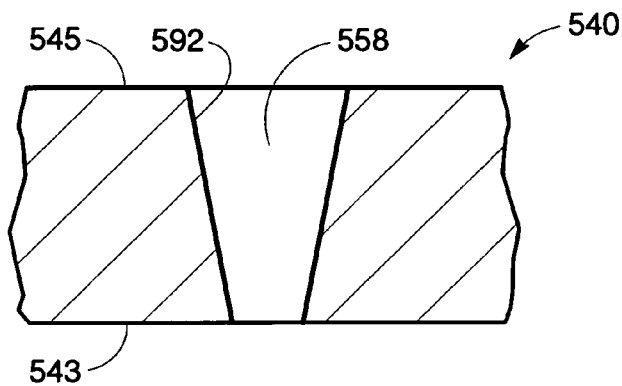
FIG. 5d is a cross-sectional view of an anchor structure formed in flexible circuit according to an alternate embodiment of the present invention.
Figure 5E:
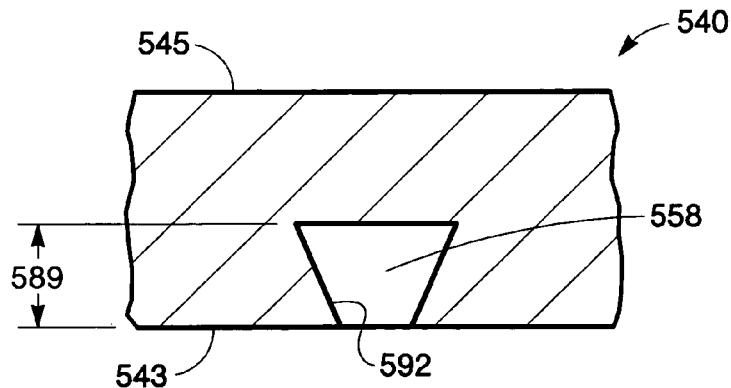
FIG. 5e is a cross-sectional view of an anchor structure formed in flexible circuit according to an alternate embodiment of the present invention.

In FIGS. 5c-5e various anchor structures that may be utilized in the present invention are shown in cross-sectional views. In the embodiment shown in FIG. 5c, flexible circuit 540 includes anchor structure 558 includes first anchor portion 558a having first anchor structure diameter, width, opening area 594, or some combination thereof having a cross-sectional area in the plane formed by external surface 545 and disposed substantially over second anchor portion 558b having a second anchor structure diameter, width, opening area 596, or some combination thereof having a cross-sectional area in the plane formed by said attaching surface 543. In addition, first anchor portion 558a includes first anchor portion depth 590 extending into flexible circuit 540 from external surface 545; and second anchor portion 558b includes second anchor portion depth 592 extending into flexible circuit 540 from attaching surface 543. In this embodiment, first anchor structure diameter and first anchor portion depth 590 are greater than second anchor structure diameter and second anchor portion depth 592; however, in alternate embodiments a wide variety of depths and diameters or opening areas also may be utilized. For example, in one embodiment, first anchor portion depth 590 may be less than second anchor portion depth 591.

In the embodiment shown in FIG. 5d, anchor structure 558 includes anchor structure sidewall 592 that has a slope wherein the diameter, width, opening area, or some combination thereof is greater at external surface 545 than at attaching surface 543 of flexible circuit 540. In this embodiment, anchor structure 558 extends completely through the flexible circuit from external surface 545 to attaching surface 543.

In the embodiment shown in FIG. 5e anchor structure 558 includes anchor structure sidewall 592 formed to first anchor portion depth 590 that is less than the total thickness of flexible circuit 540 and extends into the flexible circuit from attaching surface 543. Anchor structure sidewall 592 has a slope wherein the diameter, width, opening area, or some combination thereof increases in moving from attaching surface 543 toward external surface 545.

What is claimed is:

1. A method of using a flexible circuit, comprising:
attaching a first portion of the flexible circuit, via an attaching surface of the flexible circuit, to a first surface of a chip carrier, said chip carrier having said first surface including a first surface normal and a second surface including a second surface normal, said first and said second surface normals intersecting at an angle greater than 10 degrees, wherein said first and second surfaces form a edge, said first surface of said chip carrier having a fluid ejector chip mounted thereto, said fluid ejector chip having at least one fluid ejector disposed thereon;
statically bending a bending portion of the flexible circuit around said edge;
aligning said bending portion proximate to said first edge;
adhesively attaching a second portion of the flexible circuit, via said attaching surface to said second surface of said chip carrier, said second portion of the flexible circuit having at least one first anchor structure formed in said attaching surface, wherein said at least one first anchor structure is adapted to accept an adhesive, and wherein no conductive trace of said flexible circuit protrudes into said at least one first anchor structure; and
forming at least one adhesive anchor by flowing said adhesive into said at least one first anchor structure from said attaching surface while adhesively attaching said flexible circuit to said second surface.

2. The method in accordance with claim 1, wherein said angle is greater than about 70 degrees.

3. The method in accordance with claim 1, wherein attaching said first portion further comprises adhesively attaching said first portion.

4. The method in accordance with claim 1, wherein adhesively attaching said second portion further comprises adhesively attaching said second portion utilizing a high modulus adhesive.

5. The method in accordance with claim 1, wherein attaching said first portion further comprises mechanically fastening said first portion of the flexible circuit to said first surface of said chip carrier.

6. The method in accordance with claim 1, further comprising fabricating the flexible circuit having at least one conductive trace disposed between a first insulative layer and a second insulative layer, wherein said at least one first anchor structure is formed in said attaching surface of said second portion of said second insulative layer.

7. The method in accordance with claim 6, further comprising forming at least one second anchor structure in said second portion of said second insulative layer.

8. The method in accordance with claim 7, further comprising forming multiple first and second anchor structures in said second portion of said second insulative layer.

9. The method in accordance with claim 6, further comprising forming one or more first anchor structures in said first portion of said second insulative layer.

10. The method in accordance with claim 9, further comprising forming one or more second anchor structures in said first portion of said second insulative layer.

11. The method in accordance with claim 10, further comprising forming multiple first and second anchor structures in said first portion of said second insulative layer.

12. The method in accordance with claim 6, further comprising:
forming a first adhesive layer between said at least one conductive trace and said first insulative layer; and
forming a second adhesive layer between said at least one conductive trace and said second insulative layer.

13. The method in accordance with claim 12, further comprising forming said at least first anchor structure through said first and second insulative layers and through said first and second adhesive layers.

14. The method in accordance with claim 12, further comprising forming at least one second anchor structure through said second insulative layer and at least partially into said second adhesive layer.

15. The method in accordance with claim 6, wherein said first insulative layer further comprises a first insulative layer thickness, and wherein said second insulative layer further comprises a second insulative layer thickness, wherein said first insulative layer thickness differs from said second insulative thickness.

16. The method in accordance with claim 1, further comprising forming at least one second anchor structure in said attaching surface, wherein said at least one second anchor structure has a second anchor depth different from a first anchor depth of said at least one first anchor structure.

17. The method in accordance with claim 1, further comprising forming at least one second anchor structure in said attaching surface, wherein said at least one second anchor structure has a second anchor cross-sectional area in a plane formed by said attaching surface different from a first anchor cross-sectional area of said at least one first anchor structure in said plane.

18. The method in accordance with claim 1, further comprising forming said at least one first anchor structure in said attaching surface.

19. The method in accordance with claim 18, wherein creating said at least one first anchor structure further comprises creating said at least one first anchor structure having at least one sidewall, wherein said at least one sidewall tapers outwardly from said attaching surface toward an external surface of the flexible circuit.

20. The method in accordance with claim 18, wherein forming said at least one first anchor structure further comprises forming said at least one first anchor structure extending from said attaching surface to an external surface of the flexible circuit to create at least one first anchor hole.

21. The method in accordance with claim 20, wherein creating said at least one first anchor hole further comprises creating said at least one first anchor hole having at least one sidewall, wherein said at least one sidewall tapers outwardly from said attaching surface to said external surface.

22. The method in accordance with claim 20, wherein creating said at least one first anchor hole further comprises creating said at least one first anchor hole having a first cross-sectional area in a first plane formed by an external surface of the flexible circuit and a second cross-sectional area in a second plane formed by said attaching surface, wherein said first and said second cross-sectional areas differ.

23. The method in accordance with claim 18, wherein forming said at least one first anchor structure further comprises forming a first anchor portion disposed substantially over and in contact with a second anchor portion.

24. The method in accordance with claim 23, wherein forming said first anchor portion further comprises forming said first anchor portion having a first cross-sectional area in a first plane formed by an external surface of the flexible circuit and said second anchor portion having a second cross-sectional area in a second plane formed by said attaching surface, wherein said first and said second cross-sectional areas differ.

25. The method in accordance with claim 23, wherein forming said first anchor portion further comprises forming said first anchor portion having a first portion depth extending into the flexible circuit from an external surface of the flexible circuit and said second anchor portion having a second portion depth extending into the flexible circuit from said attaching surface, wherein said first and said second portion depths differ.

26. The method in accordance with claim 18, further comprising forming a solder anchor in said at least one first anchor structure, said solder anchor soldered to a solder pad disposed on said second surface of said chip carrier.

27. The method in accordance with claim 1, further comprising forming an adhesive anchor in said at least one first anchor structure, said adhesive anchor adhesively attached to said second portion of the flexible circuit, adhesively attached to said at least one first anchor structure, and adhesively attached to said second surface of said chip carrier.

28. The method in accordance with claim 1, further comprising:
heating an attaching adhesive layer having an adhesive, said attaching adhesive layer disposed between said attaching surface of the flexible circuit and said second surface of said chip carrier; and
urging a portion of said adhesive from said attaching adhesive layer into said at least one first anchor structure.

29. The method in accordance with claim 28, wherein urging said portion further comprises:
urging said portion of adhesive through said at least one first anchor structure, wherein said at least one first anchor structure extends through the flexible circuit; and
forming an adhesive cap over said at least one first anchor structure.

30. The method in accordance with claim 28, wherein heating said attaching adhesive layer further comprises heating said attaching adhesive layer to at least a softening temperature of said adhesive.

31. The method in accordance with claim 1, further comprises attaching a fluid ejector chip to said chip carrier.

32. The method in accordance with claim 31, further comprising:
forming a reservoir in a fluid ejection body;
forming a fluid ejector actuator on said fluid ejector chip; and
fluidically coupling said reservoir to said fluid ejector actuator.

33. The method in accordance with claim 31, further comprising:
forming at least one fluidic chamber in a chamber definition layer disposed over said fluid ejector chip;
forming a nozzle layer having at least one nozzle, said nozzle layer disposed over said chamber definition layer; and
forming at least one fluid ejector actuator on said fluid ejector chip, said at least one fluid ejector actuator substantially surrounded by said at least one fluidic chamber.

34. The method in accordance with claim 31, wherein attaching said fluid ejector chip further comprises attaching said fluid ejector chip to said first surface of said chip carrier.

35. The method in accordance with claim 34, further comprising electrically connecting said fluid ejector chip to the flexible circuit.

36. A fluid ejection device, comprising:
at least one fluid ejector disposed over a fluid ejector chip;
a chip carrier mounted to said fluid ejector chip, said chip carrier having a first surface including a first surface normal and a second surface including a second surface normal, said first and said second surface normals intersect at angle greater than 10 degrees, wherein said first and second surfaces form an edge;
a flexible circuit having a first portion, a bending portion, and a second portion, said second portion having at least one first anchor structure formed in an attaching surface of said flexible circuit, said first portion attached to said first surface of said chip carrier, said bending portion statically bent around said edge, and said attaching surface attached by an adhesive to said second surface, wherein said bending portion is aligned at least proximate to said edge, and wherein no conductive trace of said flexible circuit protrudes into said at least one first anchor structure; and
at least one adhesive anchor formed by flow of said adhesive into said at least one first anchor structure from said attaching surface during attachment of said flexible circuit to said second surface.

37. The fluid ejection device in accordance with claim 36, wherein said flexible circuit further comprises at least one conductive trace disposed between a first insulative layer and a second insulative layer, wherein said at least one first anchor structure is formed in said attaching surface of said second portion of said second insulative layer.

38. The fluid ejection device in accordance with claim 37, wherein said flexible circuit further comprises at least one second anchor structure formed in said second portion of said second insulative layer and different in structure from said at least one first anchor structure.

39. The fluid ejection device in accordance with claim 38, wherein said at least one first and second anchor structures further comprise multiple first and second anchor structures in said second portion of said second insulative layer.

40. The fluid ejection device in accordance with claim 37, wherein said flexible circuit further comprises one or more first anchor structures formed in said first portion of said second insulative layer.

41. The fluid ejection device in accordance with claim 40, further comprising one or more second anchor structures formed in said first portion of said second insulative layer.

42. The fluid ejection device in accordance with claim 41 wherein said at least one first and said one or more second anchor structures further comprise multiple first and second anchor structures formed in said first portion of said second insulative layer.

43. The fluid ejection device in accordance with claim 36, wherein said at least one first anchor structure includes at least one sidewall, wherein said at least one sidewall tapers outwardly from said attaching surface toward an external surface of the flexible circuit.

44. The fluid ejection device in accordance with claim 36, wherein said flexible circuit further comprises at least one second anchor structure formed in said attaching surface, wherein said at least one second anchor structure has a second anchor depth different from a first anchor depth of said at least one first anchor structure.

45. The fluid ejection device in accordance with claim 36, wherein said flexible circuit further comprises at least one second anchor structure formed in said attaching surface, wherein said at least one second anchor structure has a second anchor cross-sectional area in a plane formed by said attaching surface different from a first anchor cross-sectional area of said at least one first anchor structure in said plane.

46. The fluid ejection device in accordance with claim 36, wherein said at least one first anchor structure further comprises said at least one first anchor structure extending from said attaching surface to an external surface of the flexible circuit whereby at least one first anchor hole is formed.

47. The fluid ejection device in accordance with claim 46, wherein said at least one first anchor hole further comprises said at least one first anchor hole having at least one sidewall, wherein said at least one sidewall tapers outwardly from said attaching surface to said external surface.

48. The fluid ejection device in accordance with claim 46, wherein said at least one first anchor hole further comprises said at least one first anchor hole having a first cross-sectional area in a first plane formed by an external surface of the flexible circuit and a second cross-sectional area in a second plane formed by said attaching surface, wherein said first cross-sectional area is greater than said second cross-sectional area.

49. The fluid ejection device in accordance with claim 36, further comprising an adhesive anchor formed in said at least one first anchor structure, said adhesive anchor adhesively attached to said second portion of the flexible circuit, adhesively attached to said at least one first anchor structure, and adhesively attached to said second surface of said chip carrier.

50. The fluid ejection device in accordance with claim 36, further comprising at least one nozzle adapted to eject a fluid, said nozzle fluidically coupled to said fluid ejector.

51. The fluid ejection device in accordance with claim 36, further comprising:
a substrate electrical connector disposed on a substrate;
a flexible circuit lead electrically coupled to said substrate electrical connector; and
an information storage element electrically coupled to a controller.

52. The fluid ejection device in accordance with claim 36, wherein said angle is greater than about 70 degrees.

53. The fluid ejection device of claim 36, wherein said adhesive attaches substantially all of said attaching surface to said second surface.

54. A fluid ejection device, comprising:
at least one fluid ejector disposed over a fluid ejector chip;
a chip carrier mounted to said fluid ejector chip, said chip carrier having a first surface including a first surface normal and a second surface including a second surface normal, said first and said second surface normals intersect at angle greater than 10 degrees, wherein said first and second surfaces form an edge; and
a flexible circuit having a first portion, a bending portion, and a second portion, said second portion having at least one first anchor structure formed in an attaching surface of said flexible circuit, said first portion attached to said first surface of said chip carrier, said bending portion statically bent around said edge, and said second portion adhesively attached to said second surface, wherein said bending portion is aligned at least proximate to said edge, and wherein said at least one first anchor structure further comprises a first anchor portion disposed substantially over a second anchor portion, said first anchor portion in contact with, and having different sidewalls from, said second anchor portion.

55. The fluid ejection device in accordance with claim 54, wherein said first anchor portion further comprises said first anchor portion having a first cross-sectional area in a first plane formed by an external surface of the flexible circuit and said second anchor portion having a second cross-sectional area in a second plane formed by said attaching surface, wherein said first and said second cross-sectional areas differ.

56. The fluid ejection device in accordance with claim 54, wherein said first anchor portion further comprises said first anchor portion having a first portion depth extending into the flexible circuit from an external surface of the flexible circuit and said second anchor portion having a second portion depth extending into the flexible circuit from said attaching surface, wherein said first and said second portion depths differ.

57. The fluid ejection device of claim 54, wherein said at least one first anchor structure is not adjacent said fluid ejector chip.

58. The fluid ejection device of claim 54, wherein said at least one anchor structure does not provide access to a bond pad of said fluid ejector chip.

59. A fluid ejection device, comprising:
at least one fluid ejector disposed over a fluid ejector chip;
a chip carrier mounted to said fluid ejector chip, said chip carrier having a first surface including a first surface normal and a second surface including a second surface normal, said first and said second surface normals intersect at angle greater than 10 degrees, wherein said first and second surfaces form an edge;
a flexible circuit having a first portion, a bending portion, and a second portion, said second portion having at least one first anchor structure formed in an attaching surface of said flexible circuit, said first portion attached to said first surface of said chip carrier, said bending portion statically bent around said edge, and said attaching surface attached by an adhesive to said second surface, wherein said bending portion is aligned at least proximate to said edge; and
at least one adhesive anchor formed by flow of said adhesive into said at least one first anchor structure from said attaching surface during attachment of said flexible circuit to said second surface, wherein said at least first anchor structure is recessed partway into said flexible circuit from said attaching surface and does not extend through said flexible circuit to its opposing surface.

60. A fluid ejection device, comprising:
at least one fluid ejector disposed over a fluid ejector chip;
a chip carrier mounted to said fluid ejector chip, said chip carrier having a first surface including a first surface normal and a second surface including a second surface normal, said first and said second surface normals intersect at angle greater than 10 degrees, wherein said first and second surfaces form an edge;
a flexible circuit having a first portion, a bending portion, and a second portion, said second portion having at least one first anchor structure formed in an attaching surface of said flexible circuit, said first portion attached to said first surface of said chip carrier, said bending portion statically bent around said edge, and said attaching surface attached by an adhesive to said second surface, wherein said bending portion is aligned at least proximate to said edge; and
at least one adhesive anchor formed by flow of said adhesive into said at least one first anchor structure from said attaching surface during attachment of said flexible circuit to said second surface, wherein said flexible circuit further comprises one or more first anchor structures formed in said first portion of said flexible circuit.

61. The fluid ejection device in accordance with claim 60, further comprising one or more second anchor structures formed in said first portion of said flexible circuit.

62. The fluid ejection device in accordance with claim 60, wherein said at least one first and said one or more second anchor structures further comprise multiple first and second anchor structures formed in said first portion of said flexible circuit.

\* \* \* \* \*

UNITED STATES PATENT AND TRADEMARK OFFICE
CERTIFICATE OF CORRECTION

PATENT NO. : 7,658,470 B1
APPLICATION NO. : 11/118200
DATED : February 9, 2010
INVENTOR(S) : Brian Jones et al.

It is certified that error appears in the above-identified patent and that said Letters Patent is hereby corrected as shown below:

In column 14, line 21, in Claim 1, delete "a" and insert -- an --, therefor.

Signed and Sealed this

Eleventh Day of May, 2010

David J. Kappos
*Director of the United States Patent and Trademark Office*